US008957686B2

(12) United States Patent
Ueda et al.

(10) Patent No.: US 8,957,686 B2
(45) Date of Patent: Feb. 17, 2015

(54) VOLTAGE MEASUREMENT DEVICE AND VOLTAGE MEASUREMENT SYSTEM

(75) Inventors: Masahiro Ueda, Hitachinaka (JP); Yoshinori Aoshima, Tsukubamirai (JP); Akihiko Kudo, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 282 days.

(21) Appl. No.: 13/405,578

(22) Filed: Feb. 27, 2012

(65) Prior Publication Data

US 2012/0223722 A1   Sep. 6, 2012

(30) Foreign Application Priority Data

Mar. 2, 2011   (JP) ................................. 2011-045185

(51) Int. Cl.
   *G01R 31/36*   (2006.01)
(52) U.S. Cl.
   CPC .......... *G01R 31/3658* (2013.01); *G01R 31/362* (2013.01)
   USPC ........... 324/537; 324/416; 324/426; 324/429; 320/124
(58) Field of Classification Search
   CPC ....................................... G01R 31/36–31/3696
   USPC ................... 324/426–450, 537, 538
   See application file for complete search history.

(56) References Cited

U.S. PATENT DOCUMENTS

| 5,710,503 A * | 1/1998 | Sideris et al. ................. 324/431 |
| 8,103,401 B2 | 1/2012 | Kubo et al. |
| 2002/0196025 A1 * | 12/2002 | Freeman et al. ............... 324/426 |
| 2006/0113986 A1 | 6/2006 | Ariyoshi |
| 2008/0079434 A1 * | 4/2008 | Oosawa et al. ................ 324/433 |
| 2011/0031812 A1 * | 2/2011 | Morimoto ........................ 307/77 |

FOREIGN PATENT DOCUMENTS

| JP | 60-20159 A | 2/1985 |
| JP | 8-330959 A | 12/1996 |
| JP | 2000-55966 A | 2/2000 |
| JP | 2006-153688 A | 6/2006 |
| JP | 2009-183025 A | 8/2009 |
| JP | 2010-206981 A | 9/2010 |

OTHER PUBLICATIONS

Japanese Office Action with English translation thereof Dated Jul. 2, 2013 {Seven (7) Pages}.

* cited by examiner

*Primary Examiner* — Melissa Koval
*Assistant Examiner* — Emily Chan
(74) *Attorney, Agent, or Firm* — Crowell & Moring LLP

(57) ABSTRACT

A voltage measurement device, includes: a multiplexer that includes a plurality of input terminals at which voltage signals are inputted; a control circuit that performs voltage measurement by acquiring the voltage signal at a selected input terminal from the multiplexer; and a decision circuit that makes a decision as to whether or not an abnormality has occurred, based upon voltage values measured by the control circuit, wherein: the plurality of input terminals include input terminals at which voltage signals from a plurality of subjects of measurement are inputted, and an input terminal at which a potential for diagnosis is inputted; the control circuit, when performing voltage measurement for the plurality of subjects of measurement, measures voltages at the input terminals at which the voltage signals from the plurality of subjects of measurement are inputted, and a voltage at the input terminal at which the potential for diagnosis is inputted.

13 Claims, 13 Drawing Sheets

TEMPERATURE MEASUREMENT DEVICE 1000

FIG.2

| A | B | C | INH | INPUT TERMINAL |
|---|---|---|---|---|
| 0 | 0 | 0 | 0 | IN1 |
| 1 | 0 | 0 | 0 | IN2 |
| 0 | 1 | 0 | 0 | IN3 |
| 1 | 1 | 0 | 0 | IN4 |
| 0 | 0 | 1 | 0 | IN5 |
| 1 | 0 | 1 | 0 | IN6 |
| 0 | 1 | 1 | 0 | IN7 |
| 1 | 1 | 1 | 0 | IN8 |
| 1/0 | 1/0 | 1/0 | 1 | NOT CONNECTED |

1=H   0=L

| A | B | C | INH | INPUT TERMINAL |
|---|---|---|---|---|
| 0 | 0 | 0 | 0 | IN1 |
| 0→1 | 0 | 0 | 1 | NOT CONNECTED |
| 1 | 0 | 0 | 0 | IN2 |
| 1→0 | 0→1 | 0 | 1 | NOT CONNECTED |
| 0 | 1 | 0 | 0 | IN3 |
| 0→1 | 1 | 0 | 1 | NOT CONNECTED |
| 1 | 1 | 0 | 0 | IN4 |
| 1→0 | 1→0 | 0→1 | 1 | NOT CONNECTED |
| 0 | 0 | 1 | 0 | IN5 |
| 0→1 | 0 | 1 | 1 | NOT CONNECTED |
| 1 | 0 | 1 | 0 | IN6 |
| 1→0 | 0→1 | 1 | 1 | NOT CONNECTED |
| 0 | 1 | 1 | 0 | IN7 |
| 0→1 | 1 | 1 | 1 | NOT CONNECTED |
| 1 | 1 | 1 | 0 | IN8 |

CHANGEOVER SEQUENCE

| INPUT TERMINAL MEASURED | INPUT CHANGEOVER | MEASURED VOLTAGE (V) ||
|---|---|---|---|
| | | DURING NORMAL CONDITIONS | WHEN MUX INPUT IS OPEN CIRCUITED |
| IN1 | IN8 (GND) | — | — |
| | IN1 | 1 | 0.1 |
| IN2 | IN8 (GND) | — | — |
| | IN2 | 1.5 | 0.1 |
| IN3 | IN8 (GND) | — | — |
| | IN3 | 2 | 0.1 |
| IN4 | IN8 (GND) | — | — |
| | IN4 | 2.5 | 0.1 |
| IN5 | IN8 (GND) | — | — |
| | IN5 | 3 | 0.1 |
| IN6 | IN8 (GND) | — | — |
| | IN6 | 3.5 | 0.1 |
| IN7 (Vcc) | IN8 (GND) | — | — |
| | IN7 | 5 | 0.1 |
| IN8 (GND) | IN8 (GND) | — | — |
| | IN8 | 0 | 4.9 |

MEASUREMENT AND CONTROL SEQUENCE ↓

FIG.7

| INPUT TERMINAL MEASURED | INPUT CHANGEOVER | MEASURED VOLTAGE (V) | | MEASURED VALUE 2 − MEASURED VALUE 1 |
|---|---|---|---|---|
| | | DURING NORMAL CONDITIONS | WHEN MUX INPUT IS OPEN CIRCUITED | |
| IN1 | IN8 (GND) | − | − | 4.8 |
| | IN1 | 1 | 0.1 | |
| | IN7 (Vcc) | − | − | |
| | IN1 | 1 | 4.9 | |
| IN2 | IN8 (GND) | − | − | 4.8 |
| | IN2 | 1.5 | 0.1 | |
| | IN7 (Vcc) | − | − | |
| | IN2 | 1.5 | 4.9 | |
| IN3 | IN8 (GND) | − | − | 4.8 |
| | IN3 | 2 | 0.1 | |
| | IN7 (Vcc) | − | − | |
| | IN3 | 2 | 4.9 | |
| IN4 | IN8 (GND) | − | − | 4.8 |
| | IN4 | 2.5 | 0.1 | |
| | IN7 (Vcc) | − | − | |
| | IN4 | 2.5 | 4.9 | |
| IN5 | IN8 (GND) | − | − | 4.8 |
| | IN5 | 3 | 0.1 | |
| | IN7 (Vcc) | − | − | |
| | IN5 | 3 | 4.9 | |
| IN6 | IN8 (GND) | − | − | 4.8 |
| | IN6 | 3.5 | 0.1 | |
| | IN7 (Vcc) | − | − | |
| | IN6 | 3.5 | 4.9 | |
| IN7 (Vcc) | IN8 (GND) | − | − | 0 |
| | IN7 (Vcc) | 5 | 0.1 | |
| | IN7 (Vcc) | − | − | |
| | IN7 (Vcc) | 5 | 0.1 | |
| IN8 (GND) | IN8 (GND) | − | − | 0 |
| | IN8 (GND) | 0 | 4.9 | |
| | IN7 (Vcc) | − | − | |
| | IN8 (GND) | 0 | 4.9 | |

MEASUREMENT AND CONTROL SEQUENCE ↓

VOLTAGE MEASUREMENT DEVICE AND VOLTAGE MEASUREMENT SYSTEM

INCORPORATION BY REFERENCE

The disclosure of the following priority application is herein incorporated by reference: Japanese Patent Application No. 2011-045185 filed Mar. 2, 2011.

BACKGROUND OF THE INVENTION

1. Field of the Invention

The present invention relates to a voltage measurement device that employs a multiplexer, and to a voltage measurement system.

2. Description of Related Art

In the prior art it has been per se known to use a voltage measurement device that employs a multiplexer for performing measurement of the voltages of a battery, as for example described in Japanese Laid Open Patent Publication 2009-183025. With the cell voltage measurement device described in Japanese Laid Open Patent Publication 2009-183025, a circuit for performing diagnosis of the multiplexer is provided, and it is arranged to perform diagnosis as to whether or not the multiplexer is operating normally by using this diagnosis circuit. And a method is described in which a voltage comparison circuit, a decision circuit, an OR circuit, a voltage source, and so on are provided as such a diagnosis circuit, and in which, during measurement of the voltages of the battery cells, diagnosis of the multiplexer is performed by comparison with a reference voltage.

SUMMARY OF THE INVENTION

However in many cases the multiplexer is used for some purpose other than measurement of the voltages of battery cells, and there is the problem that, in these cases, the provision of the circuit for diagnosis described above entails increase of the cost of production.

According to the 1st aspect of the present invention, a voltage measurement device, comprises: a multiplexer that includes a plurality of input terminals at which voltage signals are inputted, an input changeover terminal at which a changeover signal for changing over the plurality of input terminals is inputted, and an output terminal; a control circuit that performs voltage measurement by inputting the changeover signal to the input changeover terminal of the multiplexer and thus causing the multiplexer to select one of the plurality of input terminals, and by acquiring the voltage signal at a selected input terminal from the multiplexer; and a decision circuit that makes a decision as to whether or not an abnormality has occurred, based upon voltage values measured by the control circuit, wherein: the plurality of input terminals include input terminals at which voltage signals from a plurality of subjects of measurement are inputted, and an input terminal at which a potential for diagnosis is inputted; the control circuit, when performing voltage measurement for the plurality of subjects of measurement, measures voltages at the input terminals at which the voltage signals from the plurality of subjects of measurement are inputted, and a voltage at the input terminal at which the potential for diagnosis is inputted; and the decision circuit makes a decision as to an abnormality, based upon the voltage values measured by the control circuit.

According to the 2nd aspect of the present invention, in the voltage measurement device according to the 1st aspect, it is preferred that a voltage source that generates a voltage higher than a normal voltage range for the subjects of measurement is connected to the input terminal at which the potential for diagnosis is inputted.

According to the 3rd aspect of the present invention, in the voltage measurement device according to the 1st aspect, it is preferred that a ground of the multiplexer is connected to the input terminal at which the potential for diagnosis is inputted.

According to the 4th aspect of the present invention, in the voltage measurement device according to the 1st aspect, it is preferred that the input terminal at which the potential for diagnosis is inputted includes an input terminal at which a voltage source that generates a voltage higher than a normal voltage range for the subjects of measurement is connected, and an input terminal at which a ground of the multiplexer is connected.

According to the 5th aspect of the present invention, in the voltage measurement device according to any one of the 2nd through 4th aspects, it is preferred that: the multiplexer includes an operation control input terminal at which an inactivating signal that, irrespective of the changeover signal inputted to the input changeover terminal, makes an inactivated state in which all of the plurality of input terminals and the output terminal are disconnected to each other, and an activating signal that makes the changeover signal inputted to the input changeover terminal effective, are inputted; and the control circuit, when changing over a state of selection of the input terminals, after having inputted the inactivating signal to the multiplexer, then inputs the changeover signal and the activating signal.

According to the 6th aspect of the present invention, in the voltage measurement device according to the 4th aspect, it is preferred that the decision circuit determines that there is an abnormality of the multiplexer, when the measured voltage values at the plurality of input terminals are all the same value.

According to the 7th aspect of the present invention, in the voltage measurement device according to the 1st aspect, it is preferred that the decision circuit determines that there is an abnormality of the multiplexer, when a measured voltage value at the input terminal at which the potential for diagnosis is inputted is different from a voltage value corresponding to the potential for diagnosis.

According to the 8th aspect of the present invention, in the voltage measurement device according to the 2nd or 4th aspect, it is preferred that: the control circuit, after having temporarily selected the input terminal that is connected to the voltage source, then selects an input terminal at which a voltage signal from one of the subjects of measurement is inputted and performs voltage measurement; and the decision circuit determines that there is an open circuiting abnormality of the input terminal at which the voltage signal from that one of the subjects of measurement is inputted, when the measured voltage value is higher than a threshold value that is determined based upon the voltage value of the voltage source.

According to the 9th aspect of the present invention, in the voltage measurement device according to the 3rd or 4th aspect, it is preferred that: the control circuit, after having temporarily selected the input terminal that is connected to the ground, then selects an input terminal at which a voltage signal from one of the subjects of measurement is inputted and performs voltage measurement; and the decision circuit determines that there is an open circuiting abnormality of the input terminal at which the voltage signal from that one of the subjects of measurement is inputted, when the measured voltage value is lower than a threshold value that is determined based upon ground potential.

According to the 10th aspect of the present invention, in the voltage measurement device according to the 4th aspect, it is preferred that: the control circuit, when measuring a voltage at an input terminal at which a voltage signal from one of the subjects of measurement is inputted, performs a first voltage measurement in which, after having temporarily selected the input terminal that is connected to the ground, the input terminal at which the voltage signal from that one of the subjects of measurement is inputted is selected to be measured, and a second voltage measurement in which, after having temporarily selected the input terminal that is connected to the voltage source, the input terminal at which the voltage signal from that one of the subjects of measurement is inputted is selected to be measured; and the decision circuit determines that there is an open circuiting abnormality of the input terminal at which the voltage signal from that one of the subjects of measurement is inputted, when a difference between a voltage value measured in the second voltage measurement and a voltage value measured in the first voltage measurement is greater than a threshold value that is determined based upon a voltage value of the voltage source.

According to the 11th aspect of the present invention, in the voltage measurement device according to any one of the 2nd through 5th aspects, it is preferred that: the voltage measurement device further comprises RC filters each comprising a filter resistor and a filter capacitor, provided between the input terminals and the subjects of measurement; the control circuit performs one or more times an operation of temporarily selecting the input terminal that is connected to the voltage source, and then selecting the input terminal at which a voltage signal from one of the subjects of measurement is inputted, and thereafter performs voltage measurement at the input terminal at which the voltage signal from that one of the subjects of measurement is inputted; and the decision circuit determines that there is an open circuiting abnormality of the filter resistor corresponding to the input terminal, when the measured voltage value is higher than a threshold value that has been determined based upon the voltage value of the voltage source.

According to the 12th aspect of the present invention, in the voltage measurement device according to any one of the 2nd through 5th aspects, it is preferred that: the voltage measurement device further comprises RC filters each comprising a filter resistor and a filter capacitor, provided between the input terminals and the subjects of measurement; the control circuit performs one or more times an operation of temporarily selecting the input terminal that is connected to the ground, and then selecting the input terminal at which a voltage signal from one of the subjects of measurement is inputted, and thereafter performs voltage measurement at the input terminal at which the voltage signal from that one of the subjects of measurement is inputted; and the decision circuit determines that there is an open circuiting abnormality of the filter resistor corresponding to the input terminal, when the measured voltage value is lower than a threshold value that has been determined based upon a ground potential.

According to the 13th aspect of the present invention, a voltage measurement system comprises: a voltage measurement device that contains a multiplexer that includes a plurality of input terminals at which voltage signals are inputted, an input changeover terminal at which a changeover signal for changing over the plurality of input terminals are inputted, and an output terminal, and a control circuit that performs voltage measurement by inputting the changeover signal to the input changeover terminal of the multiplexer and thus causing the multiplexer to select one of the plurality of input terminals, and by acquiring the voltage signal at the selected input terminal from the multiplexer; and a decision device to which the measured voltage values outputted from the control circuit are inputted, and that makes a decision as to whether or not an abnormality has occurred based upon the voltage values measured by the control circuit, wherein: the plurality of input terminals include input terminals at which voltage signals from the plurality of subjects of measurement are inputted, and an input terminal at which a potential for diagnosis is inputted; and the control circuit, when performing voltage measurement for the plurality of subjects of measurement, measures voltages at the input terminals at which the voltage signals from the plurality of subjects of measurement are inputted, and a voltage at the input terminal at which the potential for diagnosis is inputted.

BRIEF DESCRIPTION OF THE DRAWINGS

FIG. 2 is a table giving the relationship between changeover signals that are inputted to input changeover terminals A, B, and C, and the input terminal that is selected when an operating control signal is inputted to an operation control terminal INH;

FIG. 6 is a figure for explanation of a measurement procedure and a control sequence, when detecting open circuiting of an input terminal of the multiplexer 1200;

FIG. 7 is a figure for explanation of another measurement procedure that can detect open circuiting of an input terminal of the multiplexer 1200;

DESCRIPTION OF PREFERRED EMBODIMENTS

Figure 1:
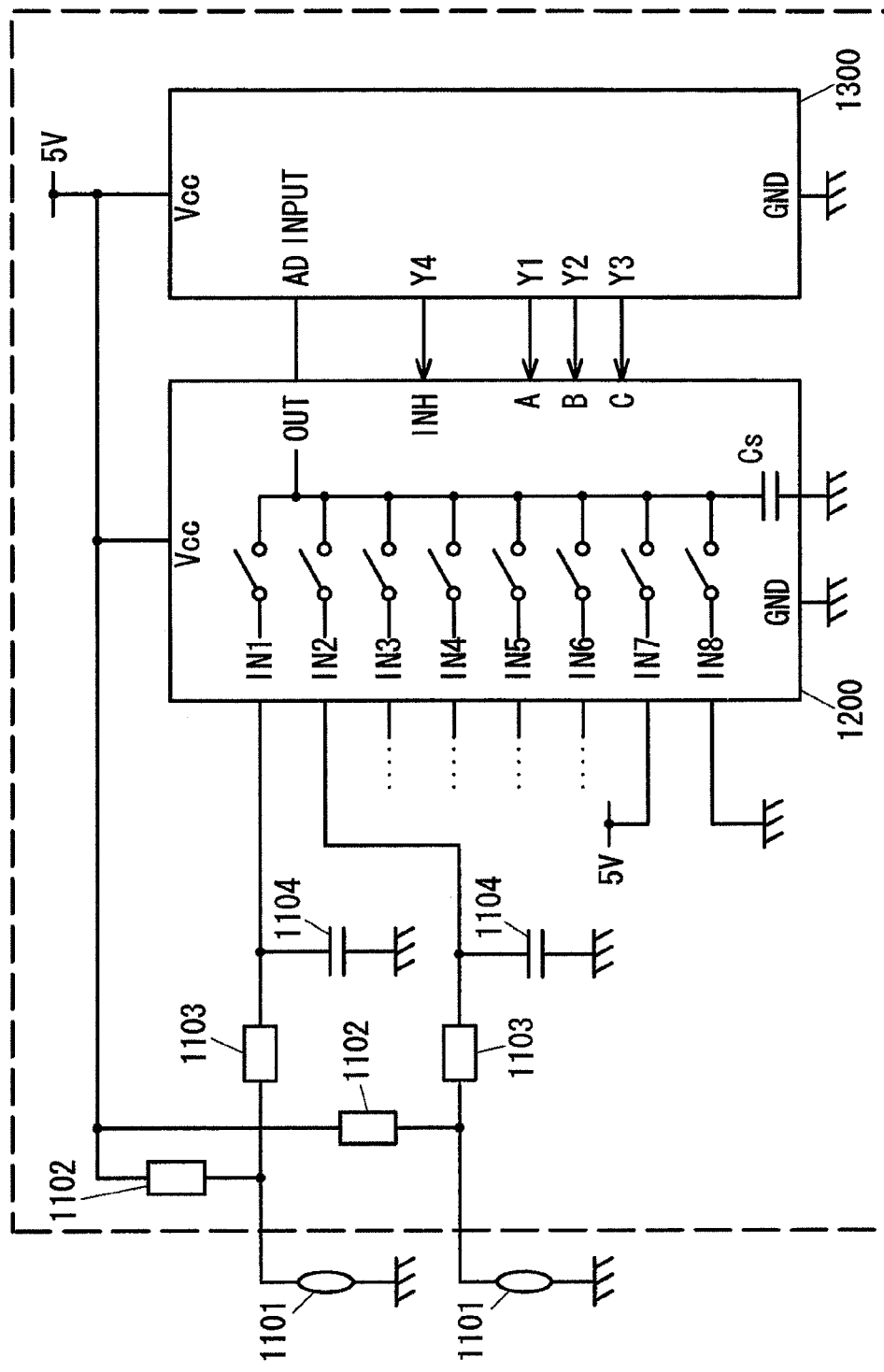
FIG. 1 is a figure showing an embodiment of the voltage measurement device according to the present invention, as applied to a temperature measurement device.

An embodiment for implementation of the present invention will now be explained with reference to the drawings. FIG. 1 is a figure showing an embodiment of the voltage measurement device according to the present invention, and shows a case in which it is applied to a temperature measurement device 1000. This temperature measurement device 1000 employs thermistors 1101 as temperature sensors. And the temperature measurement device 1000 includes a changeover multiplexer 1200 that is connected to the thermistors 1101 and that selects the voltage from one of them for measurement, and a microcomputer 1300 that inputs the voltage of a thermistor connected via the multiplexer 1200 to measure this voltage. The multiplexer 1200 and the microcomputer 1300 are supplied with operating power Vcc at a voltage of 5V.

The multiplexer 1200 has a total of eight input terminals IN1 through IN8, and, as described above, the thermistors 1101 are connected to the input terminals IN1 through IN6 respectively, with the operating power supply Vcc (5V) being connected to the input terminal IN7 and the ground GND being connected to the input terminal IN8. Each of the thermistors 1101 is connected to the operating power supply Vcc having the voltage of 5V via a pull-up resistor 1102 for current supply. And each of the points at which a thermistor 1101 and its corresponding pull-up resistor 1102 are connected together is connected to the corresponding input terminal IN1 through IN6 of the multiplexer 1200 via an RC filter consisting of a resistor 1103 and a filter capacitor 1104. It should be understood that, for ease of understanding, the thermistors 1101, the pull-up resistors 1102, the resistors 1103, and the filter capacitors 1104 that are connected to the input terminals IN3 through IN6 are not shown in FIG. 1.

The microcomputer 130 includes an analog to digital (A/D) converter (not particularly shown in the figure), and an output terminal OUT of the multiplexer 1200 is connected to an A/D input terminal of the microcomputer 1300. Three input changeover terminals A, B, and C of the multiplexer 1200 are respectively connected to three output terminals Y1, Y2, and Y3 of the microcomputer 1300. The multiplexer 1200 has an operation control terminal INH, and this operation control terminal INH is connected to an output terminal Y4 of the microcomputer 1300.

Selection of the input terminals IN1 through IN8 of the multiplexer 1200 is performed on the basis of changeover signals inputted to the input changeover terminals A, B, and C of the multiplexer 1200 from the output terminals Y1, Y2, and Y3 of the microcomputer 1300. The operation control terminal INH is a terminal for forcibly turning all of the input terminals IN1 through IN8 to OFF. When the operation control terminal INH is brought to "H" level, then the output terminal OUT is cut off from the input terminals IN1 through IN8, irrespective of the values of the changeover signals that are inputted at the input changeover terminals A, B, and C. On the other hand, when the operation control terminal INH is brought to "L" level, then the changeover signals that are inputted at the input changeover terminals A, B, and C become effective for causing changeover.

FIG. 2 is a figure giving a table showing the relationship, when the operating control signal is inputted to the operation control terminal INH, between the changeover signals that are inputted to the input changeover terminals A, B, and C, and the one of the input terminals IN1 through IN8 that is selected. One or the other of the input terminals IN1 through IN8 is selected, according to the combination of "H" level and "L" level of the changeover signals that are inputted to the input changeover terminals A, B, and C. On the other hand, as mentioned above, if the operation control signal is at "H" level, then none of the input terminals IN1 through IN8 is selected, no matter what is the combination of "H" level and "L" level of the changeover signals that are inputted to the input changeover terminals A, B, and C.

When temperature measurement is to be performed by the temperature measurement device 1000 by measuring the voltages of the thermistors 1101, then the microcomputer 1300 inputs an "L" level changeover signal to the operation control terminal INH of the multiplexer 1200, and also inputs a predetermined combination of changeover signals to the input changeover terminals A, B, and C of the multiplexer 1200, thus selecting the one of the input terminals IN1 through IN8 that is to be the subject of measurement. As a result, the voltage at the input terminal that is selected is outputted from the output terminal OUT of the multiplexer 1200. This output voltage at the output terminal OUT is inputted to the A/D input terminal of the microcomputer 1300, and measurement is performed by this voltage being converted into digital form by the A/D converter.

Figure 3:
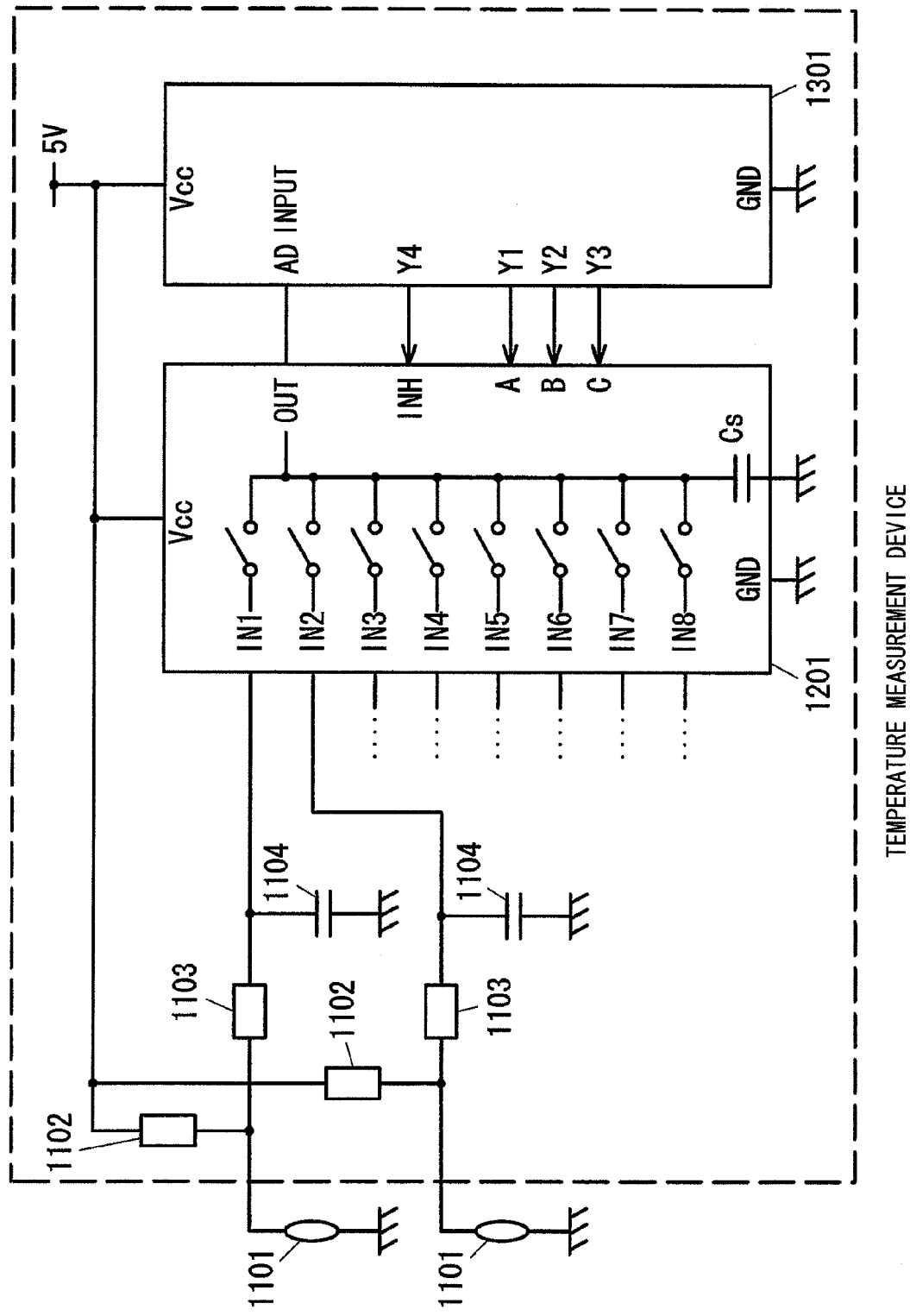
FIG. 3 is a figure showing a prior art voltage measurement device that employs a multiplexer.

On the other hand, a prior art voltage measurement device that uses a multiplexer is generally structured as shown in FIG. 3. In other words, it is not built so that its operating power supply Vcc (5V) and ground are connected to two of its selectable input terminals; rather, temperature sensors are connected to the input terminals IN7 and IN8 as well.

It is considered that there may be various causes for development of an abnormality of a temperature measurement device that employs a multiplexer for changing over its input, the majority of which are detailed below.

(1) One of the thermistors 1101 going open circuit or short circuit.
(2) One of the pull-up resistors 1102 going open circuit or short circuit.
(3) One of the filter capacitors 1104 going short circuit.
(4) The output terminal of the multiplexer 1200 going open circuit.
(5) One of the input changeover terminals of the multiplexer 1200 going open circuit or short circuit.
(6) One of the input terminals of the multiplexer 1200 going open circuit.
(7) One of the filter resistors 1103 going open circuit.

Among the above described seven possible causes of abnormality, while in the cases of (1) through (3) an abnormality can be detected even with the prior art structure shown in FIG. 3, in the cases of (4) through (7), sometimes it is the case that it is not possible to detect that an abnormality is occurring. In the following, it will be explained how, in this embodiment, the cause of an abnormality can be detected in any of these seven possible cases.

Figure 4:
FIG. 4 is a figure showing an input terminal changeover sequence when voltage measurement is performed.

When performing measurement of the voltages of the six thermistors 1101 connected to the six input terminals IN1 through IN6, it is arranged to select these terminals one by one in order from the input terminal IN1 in the changeover sequence shown in FIG. 4. Generally, with a logic circuit like the multiplexer 1200, it is common for there to be minute variations in the delay time during logical changeover. In the case of the prior art, it is arranged to perform changeover in the order from IN1 to IN2 to IN3 to . . . from the first stage in FIG. 2. In this case, for example, in the changeover from IN2 to IN3, when the input changeover terminal A is changed over from "H" to "L" and the input changeover terminal B is changed over from "L" to "H", even though it might be supposed that the changeover signals from the microcomputer 1300 are outputted absolutely simultaneously, actually there may be a minute difference between the timings of changeover "H" to "L" and "L" to "H" of the outputs of the microcomputer 1300, and the logical input detection timings at the input changeover terminals A and B of the multiplexer 1200. Due to this, if the input terminals are changed over with the operation control terminal INH of the multiplexer 1200 being kept in the activating state (i.e. at "L"), there is a possibility that connection may momentarily be established to some input terminal other than the desired one, and this is very undesirable.

Since charging or discharging of the stray capacitance (floating capacitance) Cs of the multiplexer 1200 may take place during this interval, momentary though it may be, there is a possibility that this may exert some influence upon the detection of open circuiting of the input terminals of the multiplexer 1200 that will be described hereinafter. In this embodiment, as a countermeasure against this problem, when changing over the inputs of the multiplexer 1200, first, the operation control terminal INH of the multiplexer 1200 is put into the deactivating state (i.e. is brought to "H"), so that the input terminals IN1 through IN8 and the output terminal OUT are cut off or disconnected (this is the stage shown as "not connected" in the input terminal fields of FIG. 4). Changing over of the states of the changeover signals is performed during this cut off (disconnecting) state, and subsequently it is arranged to put the operation control terminal INH of the multiplexer 1200 into the activating state (i.e. is brought to "L"), and voltage measurement is performed.

For example, consider the case of changing over from the input terminal IN1 to the input terminal IN2. When the input terminal IN1 is selected, the input changeover signals are A=B=C=0. Next, the operation control terminal INH is brought to 1 ("H"), so that the input terminals IN1 through IN8 and the output terminal OUT are cut off, and, in this state, the input changeover signals are changed over so that A=1 and B=C=0. Next, the operation control terminal INH is brought to 0 ("L"), so that the input changeover signals become effective, and the input terminal IN2 is selected.

By employing this type of operational procedure, the problem is solved of momentary connection of the multiplexer 1200 during changeover of its inputs, thus establishing connection to one of the input terminals other than the desired one. As a result, it is possible to eliminate any influence due to charging or discharging of the stray capacitance Cs of the multiplexer 1200, so that it is possible to anticipate enhancement of the reliability of the voltage measurement device.

It should be understood that, although in the following explanation is formulated as referring to results of actual measurement, in this embodiment, voltage measurement is performed under the following conditions. The voltage measurement by the six thermistors 1101 is performed every 200 msec. Furthermore, since the output voltage of the multiplexer 1200 needs a certain time before it becomes stable, accordingly it is arranged to perform A/D conversion and to perform voltage measurement around 5 μsec after changeover of the inputs of the multiplexer 1200 has been performed.

(A1) Detecting that One of the Thermistors 1101 has Gone Open Circuit or Short Circuit When one of the thermistors 1101 shown in FIG. 1 has gone short circuit, then the potential at the connection point between this thermistor 1101 and its corresponding pull-up resistor 1102 becomes 0V. Since, due to this, a voltage value equal to ground=0 is outputted from the output terminal OUT, accordingly the microcomputer 1300 is able to detect the occurrence of an abnormality by detecting that the measured voltage value has become lower than some predetermined value (i.e. is outside its normal voltage range).

On the other hand since, when one of the thermistors 1101 has gone open circuit, the potential at its connection point described above becomes Vcc=5V, accordingly it is possible to detect the occurrence of an abnormality due to the fact that the measured voltage value has become greater than some predetermined value (i.e. is outside its normal voltage range). It should be understood that the predetermined values described above for making these abnormality decisions should be set in consideration of the characteristics of the thermistor 1101, the value of the pull-up resistor 1102, and the A/D conversion accuracy of the microcomputer 1300. Moreover, it should be understood that this type of detection of open circuiting or short circuiting of the thermistors 1101 may be performed with the prior art measurement device shown in FIG. 3 as well, in a manner similar to that by which it is performed for this embodiment.

(A2) Detecting that One of the Pull-Up Resistors 1102 has Gone Open Circuit or Short Circuit When one of the pull-up resistors 1102 has gone open circuit, then the potential at the connection point between this pull-up resistor 1102 and the corresponding thermistor 1101 becomes 0V. On the other hand, if one of the pull-up resistors 1102 has become short circuited, then the potential at this connection point becomes Vcc=5V. Accordingly it is possible for the microcomputer 1300 to detect the occurrence of an abnormality by comparing the measured voltage value with predetermined values, in a similar manner to the case described above of open circuiting or short circuiting of one of the thermistors 1101. It should be understood that this type of detection of open circuiting or short circuiting of the pull-up resistors 1102 may be performed with the prior art measurement device shown in FIG. 3 as well, in a manner similar to that by which it is performed for this embodiment.

(A3) Detecting that One of the Filter Capacitors 1104 has Gone Short Circuit

Since the measured voltage value becomes 0V if one of the filter capacitors 1104 has become short circuited, accordingly it is possible for the microcomputer 1300 to detect the occurrence of an abnormality, because the measured voltage value becomes lower than some predetermined value. It should be understood that this type of detection of short circuiting of the filter capacitors 1104 may be performed with the prior art measurement device shown in FIG. 3 as well, in a manner similar to that by which it is performed for this embodiment.

(A4) Detecting that the Output Terminal Out of the Multiplexer 1200 has Gone Open Circuit Since the input of the A/D converter of the microcomputer 1300 has an input stray capacitance (although this depends on the characteristics of the A/D converter), accordingly, the A/D converter measures the voltage up to which the input stray capacitance of the A/D converter has been charged. After the output terminal OUT has become open circuited, generally, the voltage value drops gradually. Due to this, in the case of the prior art voltage measurement device shown in FIG. 3, even if open circuiting of the output terminal OUT has taken place, for some time a voltage value within the normal voltage range of the thermistor 1101 is measured, and it first becomes possible to detect an abnormality when the voltage value of this input stray capacitance drops down to near 0V after quite a long time period has elapsed. For this reason, there has been the problem with a prior art voltage measurement device that quite a long time period is required before the abnormality can be detected.

On the other hand, with the voltage measurement device 1000 of this embodiment shown in FIG. 1, it is arranged to input the voltage Vcc at the input terminal IN7 and to input ground potential at the input terminal IN8, and, during voltage measurement, it is arranged to perform measurement at all of the input terminals IN1 through IN8 as shown in FIG. 4. Due to this, it is possible to detect open circuiting of the output terminal OUT during a single measurement cycle, since measured voltage values outside the normal voltage range are obtained during measurement at the input terminals IN7 and IN8.

For example, if the open circuiting of the output terminal OUT has occurred before measurement of the voltage at the input terminal IN7, then the voltage of the input stray capacitance of the A/D converter will appear during measurement of the voltage at the input terminal IN7, and will be within the normal voltage range. Due to this, the voltage value measured at the input terminal IN7 will not be Vcc, but will be a voltage value within the normal voltage range. In a similar manner, the voltage value measured at the input terminal IN8 measured thereafter will not be 0V, but will be a voltage value within the normal voltage range. Now, during normal operation, the possibility that the voltage values measured at both of the input terminals IN7 and IN8 will be within this normal voltage range is extremely low, and also in none of the fault modes (1) through (3) described above does it ever happen that the voltage values measured at both of the input terminals IN7 and IN8 are within this normal voltage range. Accordingly, from the result of the type of measurement described above, it is possible to determine within a short time period that open circuiting of the output terminal OUT has taken place.

Furthermore, if open circuiting of the output terminal OUT has taken place during the changeover from the input terminal IN7 to another terminal (i.e. the input terminal IN8), then the voltage values that are measured thereafter at the input terminals IN1 through IN8 all will become Vcc. Even further, if open circuiting of the output terminal OUT has taken place during the changeover from the input terminal IN8 to another terminal (i.e. the input terminal IN1), then the voltage values that are measured thereafter at the input terminals IN1 through IN8 all will become 0V. On the other hand, in the fault modes (1) through (3) described above, it never happens that the voltage values that are measured at the input terminals IN1 through IN8 all become 0V (ground level) or Vcc (Vcc level) in this manner. Accordingly, if all of these voltage values measured at all of the input terminals IN1 through IN8 are the same (and this also includes the case in which the voltage values measured at all of the input terminals IN1 through IN8 are included within the normal voltage range, and are the same), then it is possible to decide within a short time period that open circuiting of the output terminal OUT has occurred.

It should be understood that it is also possible to decide that open circuiting of the output terminal OUT has occurred if all of the voltage values measured at the input terminals are the same, in the case of a measurement operation such as performing measurement of the voltages at the input terminals IN1 through IN6 and at the input terminal IN7 (Vcc), or in the case of a measurement operation such as performing measurement of the voltages at the input terminals IN1 through IN6 and at the input terminal IN8 (GND).

(A5) Detecting that One of the Input Changeover Terminals A Through C of the Multiplexer 1200 has Gone Open Circuit or Short Circuit In the case of a prior art voltage measurement device, it is not possible for the microcomputer 1300 to determine, from the measured voltage values, to which of the input terminals and the output terminals the multiplexer 1200 is actually connected. Due to this, even if open circuiting or short circuiting of one of the input changeover terminals A through C has occurred, it is not possible for the microcomputer 1300 to detect that an abnormality of this type has occurred.

As an extreme example, if the fault has occurred that the same voltage is measured at all of the input terminals without any relationship to the changeover signals from the microcomputer 1300, then this will be detected as all of the measured voltage values being the same. Due to this, no abnormality of the multiplexer 1200 will be detected, provided that this measured voltage value is within the normal range.

On the other hand, in the case of this embodiment, since it is arranged to connect the input terminal IN7 of the multiplexer 1200 to Vcc and to connect its input terminal IN8 to ground, accordingly those voltage values will fall outside the normal voltage range for the thermistors 1101. Due to this, the microcomputer 1300 is able to detect from the measured voltage values whether or not the multiplexer 1200 is properly selecting its input terminals IN7 and IN8 according to the input changeover signals.

In other words, if Vcc has not been detected as a measured voltage value when a command has been sent for measurement of the voltage at the input terminal IN7, and/or if 0V has not been detected as a measured voltage value when a command has been sent for measurement of the voltage at the input terminal IN8, then it is possible to determine that there is an abnormality with the multiplexer originating in open circuiting or short circuiting of the input changeover terminals A through C. It should be understood that since ground potential and Vcc are measured as the voltage values for determining upon an abnormality, accordingly the decision values for whether or not an abnormality is present may be determined in consideration of the maximum errors when Vcc and ground are measured.

(A6) Detecting that One of the Input Terminals of the Multiplexer 1200 has Gone Open Circuit If open circuiting of one of the input terminals of the multiplexer 1200 has occurred, then, with a prior art voltage measurement device, the voltage up to which the stray capacitance Cs of the multiplexer is charged is measured. Due to this, if there is no changeover from the input terminal upon which open circuiting has occurred to some other input terminal, then generally the voltage value will diminish gradually. However, actually the stray capacitance Cs will become undesirably charged and/or discharged along with changing over of the connection to some other input terminal, so that finally it is held at an incomplete halfway voltage.

Figure 5:
FIG. 5 is a figure showing an example of when open circuiting of an input terminal of a multiplexer 1200 occurs with a prior art voltage measurement device.

FIG. 5 shows an example of this type of case (this is an experimental example). When the input terminals IN1 through IN8 were in normal state, then the voltage values shown in the vertical column for normal conditions were measured. Each of these measured voltage values is within the normally expected range. On the other hand, the voltage values in the vertical column for open circuited input are the voltage values during open circuiting that were measured when each of the input terminals IN1 through IN8 was open circuited in turn.

For example, if the input terminal IN1 is open circuited, then the measured voltage value when the input terminal IN1 is selected will be a value close to the voltage value for the input terminal IN8 that was measured the time before (but slightly smaller). This is because the stray capacitance Cs appears at the input terminal IN8 when the input terminal IN8 is measured, and subsequently, even though changeover to the input terminal IN1 is performed, since the input terminal IN1 is open circuit, accordingly the voltage value of the stray capacitance does not change over to the voltage value during normal conditions, but instead comes to be maintained almost at the voltage value when the input terminal IN8 was connected. Moreover, if the input terminal IN2 is open circuited, then a voltage value of 0.8V is measured for the voltage value at the input terminal IN2, and this is slightly lower than the voltage value measured for the terminal IN1 (=1V). In a similar manner, if one of the input terminals IN3 through IN8 is open circuited as well, then a voltage value is measured for that terminal that is somewhat lower than the measured voltage value for the input terminal one before it.

In this manner, in the case of a prior art voltage measurement device, for the measured voltage value at an input terminal that is open circuited, a somewhat lower voltage value is measured than the measured voltage value at the input terminal that was measured directly before this input terminal was measured, and, since the measured voltage value still remains within the voltage range that is considered to be normal, it is not possible to detect the occurrence of an abnormality.

On the other hand, in the case of this embodiment, it is possible to detect open circuiting of an input terminal of the multiplexer 1200 by performing voltage measurement according to a procedure like that shown in FIG. 6. For example, to explain the example of the voltage at the input terminal IN1 being measured, first, before measuring the voltage at the input terminal IN1 that is to be the subject of measurement, the multiplexer 1200 is commanded to connect to the input terminal IN8 that is connected to ground. Subsequently, voltage measurement is performed for the input terminal IN1. In this example, before measuring the voltage at the input terminal that is to be the subject of measurement, changing over the connection to that input terminal is performed after having connected to the input terminal IN8 for about 5 μsec, and voltage measurement with the A/D converter is performed after doing so.

When, during normal conditions, the input terminal IN1 is not open circuited, then the voltage value that is measured at the input terminal IN1 is the normal value of 1V. On the other hand, if the input terminal IN1 is open circuited, then the value of the voltage of the stray capacitance Cs of the multiplexer is a voltage value almost the same as that of the input terminal IN8 that was connected directly before. A voltage value of 0.1V has been measured by experiment. When measurement was carried out in a similar manner for the other input terminals IN2 through IN7 as well, the measured voltage values when the corresponding input terminals were open circuited were also around 0.1V.

Furthermore, when measurement is performed for the input terminal IN8 as well, after having measured the voltage at the input terminal IN8, then for a second time the voltage is measured at the input terminal IN8 that is the subject for measurement. If the input terminal IN8 is open circuited, then the voltage of the stray capacitance Cs of the multiplexer has almost the same value as it did when the input terminal IN7 was connected. Experimentally this was 4.9V, and the voltage value of 4.9V was measured during measurement at the input terminal IN8.

By connecting the input terminal that is to be the subject for measurement to the input terminal IN8 that is connected to ground in this manner before measuring its voltage, and by only thereafter measuring the voltage at that input terminal, it is possible to discharge the stray capacitance Cs of the multiplexer 1200 by connecting it to ground. As a result, when the input terminal is open circuited, a voltage value is measured that is close to that of ground and that is outside the normal voltage range, and accordingly it is possible to detect open circuiting of the input terminals simply and easily.

It should be understood that while, in the example shown in FIG. 6, it is arranged to measure the voltage at the input terminal IN8 (GND) before measuring the voltage at the input terminal that is the subject for measurement, it would also be acceptable to arrange to measure the voltage at the input terminal IN7 (Vcc) instead. In this case, it would be possible to charge up the stray capacitance Cs of the multiplexer 1200 by connecting it to Vcc. As a result, when the input terminal is open circuited, a voltage value is measured that is close to Vcc, i.e. that is outside the normal voltage range, so that it is simple and easy to detect open circuiting of an input terminal.

It should be understood that since, in the above described cases of (1) open circuiting or short circuiting of one of the thermistors 1101, (2) open circuiting or short circuiting of one of the pull-up resistors 1102, (3) short circuiting of one of the filter capacitors 1104, (4) open circuiting of the output terminal of the multiplexer 1200, and (5) open circuiting or short circuiting of one of the input changeover terminals of the multiplexer 1200, it is possible to determine the occurrence of an abnormality from the measured voltage values, accordingly, with the measurement method shown in FIG. 6 as well, it is possible to detect the presence of an abnormality simply and easily according to whether or not the voltage values that have been measured are in the normal range.

FIG. 7 is a figure showing another procedure for measurement that can detect open circuiting of an input terminal of the multiplexer 1200. First, connection is established to the input terminal IN8 (GND), and thereafter connection is established to the input terminal that is to be the subject of measurement, and its voltage value is measured (this is "voltage measurement the first time"). Next, after having established connection to the input terminal IN7 (Vcc), connection is established to the same input terminal as before, and its voltage value is measured for a second time (this is "voltage measurement the second time"). And the difference between the measured voltage value the second time and the measured voltage value the first time is obtained, and it is decided that an abnormality has occurred if this difference is greater than some predetermined value.

To explain the case of the input terminal IN1 as an example, during normal conditions in which the input terminal IN1 is not open circuited, both the measured voltage value the first time and the measured voltage value the second time will be a normal voltage value of 1V. Due to this, the difference between the measured voltage value the second time and the measured voltage value the first time will be 0V or very close thereto.

However, during an abnormality in which the input terminal IN1 is open circuited, by establishing connection to the input terminal IN8 directly before the first measurement at the input terminal IN1, the stray capacitance Cs of the multiplexer 1200 is discharged down to close to ground potential, so that, during voltage measurement the first time, the voltage value of the stray capacitance Cs is measured. Due to this, the measured voltage value the first time becomes 0.1V. On the other hand, since during voltage measurement the second time the voltage value of the stray capacitance Cs is measured after connection to the input terminal IN7 has been established, accordingly a voltage value close to Vcc of 4.9V comes to be measured. As a result, the difference between the measured voltage value the second time and the measured voltage value the first time becomes 4.8V. It should be understood that the voltage value in the vertical column "measured value 2−measured value 1" of FIG. 7 gives the value when the corresponding input terminal is open circuited.

As shown in FIG. 7, by performing measurement in the manner described above, for the input terminals IN1 through IN6, during normal conditions a value of 0V is obtained for the difference between the measured voltage value the second time and the measured voltage value the first time, while during open circuiting of one of the input terminals a voltage value of 4.8V is obtained for that input terminal. From this type of variation of the corresponding differences, it is possible to make a decision as to whether or not the input terminals are open circuited.

It should be understood that since during open circuiting, for the input terminal IN7, both the first time and also the second time, the voltage value of the stray capacitance Cs is measured after having initially established connection to the input terminal IN8, accordingly the measured value in both cases becomes 0.1V. Moreover since, for the input terminal IN8, the voltage value of the stray capacitance Cs is measured in the measurement at the input terminal IN7 one before, accordingly the measured value becomes 4.9V, both the first time and also the second time. Due to this, in relation to the input terminals IN7 and IN8, it is not possible to determine whether or not they are open circuited from the difference between the measured voltage value the second time and the measured voltage value the first time. However since, if one of the input terminals IN7 and IN8 is open circuited, then the value that is measured when connection to it is established is different from the anticipated value, accordingly it is possible simply and easily to detect an abnormality (i.e. open circuiting) directly from their measured voltage values.

As described above, it is possible to detect input open circuiting of the multiplexer 1200 by performing voltage measurement by the method shown in FIG. 7. Moreover, as previously described, according as to whether or not the voltage values that are measured are within the normal range or not (in the case of the input terminals IN1 through IN6) or according as to whether or not the voltage values that are measured are as anticipated (in the case of the input terminals IN7 and IN8), it is also possible to detect the presence of an abnormality due to any one of the cases described above of (1) open circuiting or short circuiting of one of the thermistors 1101, (2) open circuiting or short circuiting of one of the pull-up resistors 1102, (3) short circuiting of one of the filter capacitors 1104, (4) open circuiting of the output terminal of the multiplexer 1200, and (5) open circuiting or short circuiting of one of the input changeover terminals of the multiplexer 1200.

Furthermore, it is also possible to identify and to detect whether an abnormality is caused by one of the causes (1) through (5) listed above, or whether it is caused by open circuiting of an input of the multiplexer 1200 (i.e. by the cause (6)). In other words, if the input terminals IN1 through IN6 are normal, then the same normal voltage value will be measured both during voltage measurement the first time and also during voltage measurement the second time, and the difference between these measured voltage values will be very close to 0V. But if one of the input terminals is open circuited, then the measured voltage value the first time will be 0.1V while the measured voltage value the second time will be 4.9V, so that the difference between these two measured voltage values will be 4.8V. In the case of an abnormality that is due to one of the causes (1) through (5), the measured voltage value the first time and the measured voltage value the second time are both the same, but, according to the abnormality mode, either 0.1V or 4.9V will be detected.

It should be understood that since, if the input voltage itself fluctuates greatly, then there is also a possibility that a certain difference will be present between the value measured the first time and the value measured the second time, accordingly it is desirable for the threshold value to be determined as being the maximum voltage difference that it is supposed can occur due to this reason during the time gap between performing measurement the first time and performing measurement the second time.

(A7) Detecting that One of the Filter Resistors 1103 has Gone Open Circuit

If open circuiting of one of the filter resistors 1103 has occurred, then charge will remain in the corresponding filter capacitor 1104 even after this filter resistor 1103 has gone open circuit, since this filter capacitor 1104 is connected to the corresponding input terminal. Due to this, with a prior art measurement device, the possibility is high that, even after one of the filter resistors 1103 has gone open circuit, the measured voltage value will remain at some non-zero value. In particular with a temperature measurement device or the like, due to countermeasures against noise, it is often the case that a capacitor of comparatively high capacitance is used in order for the cutoff frequency to be low, and the value of this capacitance may be considerably larger than the stray capacitance of the multiplexer 1200.

Figure 8:
FIG. 8 is a figure showing a measured voltage value when a filter resistor 1103 goes open circuit, with a prior art voltage measurement device.

FIG. 8 shows, the voltage values measured by a prior art voltage measurement device when one of the filter resistors 1103 has gone open circuit. For example, if the filter resistor 1103 that is connected to the input terminal IN1 has gone open circuit, then a voltage value of 1V is measured directly after this filter resistor has open circuited, and this is the same as the voltage value measured before open circuiting, i.e. during normal conditions. Now suppose that thereafter, after the voltage at the input terminal IN8 has been measured, connection is established to the input terminal IN1 for a second time. When measurement is performed of the voltage at the input terminal IN8, the voltage value of the stray capacitance Cs of the multiplexer 1200 becomes the same voltage value as that of the input terminal IN8, i.e. 4.5V.

Thereafter, when the connection is changed over from the input terminal IN8 to the input terminal IN1, since the voltage of the stray capacitance Cs is higher than the voltage of the filter capacitor 1104, accordingly the filter capacitor 1104 comes to be charged up by the stray capacitance Cs. Since in this experiment the interval between voltage measurements is 200 msec, accordingly this voltage measurement is repeated on a cycle of period 200 msec, and, each time changeover from the input terminal IN8 to the input terminal IN1 is repeated, the voltage value of the filter capacitor 1104 is brought closer to the voltage value of the stray capacitance Cs (i.e. to 4.5V). And, when five minutes has elapsed after the filter capacitor 1104 going open circuit, the measured voltage value at the input terminal IN1 becomes 4.5V, as shown in FIG. 8.

In a similar manner, in the cases of the input terminals IN2 through IN8 as well, the measured voltage value five minutes after open circuiting becomes almost the same as the voltage value at the input terminal in the measurement sequence one before. In other words, finally, the voltage at the input terminal that was selected before measurement at that input terminal comes to be measured, and it is difficult to detect an abnormality from the measured voltage value.

Figure 9:
FIG. 9 is a figure for explanation of measurement and of a control sequence, when detecting open circuiting of a filter resistor 1103.

On the other hand, in this embodiment, it is possible to perform abnormality detection even if one of the filter resistors 1103 has gone open circuit by performing measurement by a method like that shown in FIG. 9. For example, suppose as a hypothesis that the filter resistor 1103 connected to the input terminal IN1 has become open circuited. In this case, directly after the open circuiting occurs, the corresponding filter capacitor 1104 is charged up to the voltage value of 1V.

The procedure during measurement for this input terminal IN1 is that, initially, connection is established to the input terminal IN7 (Vcc), so that charging up of the filter capacitor 1104 is performed to a voltage value of around Vcc. Thereafter, once voltage measurement for the input terminal IN1 has been performed, after the connection has been changed over to the terminal IN8 (GND), connection is then performed for a second time to the input terminal IN1, and voltage measurement is performed for a second time.

When connection is initially made to the input terminal IN7, the stray capacitance Cs of the multiplexer 1200 is charged up to the voltage value Vcc, and next, by connecting to the input terminal IN1, the filter capacitor 1104 that is connected to the input terminal IN1 is charged up by the stray capacitance Cs.

In the example shown in FIG. 9, the number of times that changeover is performed from the input terminal IN7 to the input terminal IN1 (in other words the number of times charging is performed) is set to 20 times, the time period for connection to the input terminal IN7 (Vcc) is set to 5 μsec, and the time period for connection to the input terminal IN1 is set to 5 pee. Due to this, the measured voltage value at the input terminal IN1 after changing over twenty times (i.e. after about 10 seconds) becomes 4.8V.

Next, after having changed over connection from the input terminal IN1 to the input terminal IN8 (GND), connection is established to the input terminal IN1 for a second time, and voltage measurement for the input terminal IN1 is performed. The number of times of connection to the input terminal IN8 and to the input terminal IN1 is in this case set to once, the time period for connection to the input terminal IN8 (GND) is set to 5 μsec, and the time period for subsequent connection to the input terminal IN1 is set to 20 msec.

By changing over from the input terminal IN1 to the input terminal IN8 (GND), the stray capacitance Cs of the multiplexer 1200 is discharged down to ground level, and, by connecting to the input terminal IN1 for a second time, the stray capacitance Cs is charged up to the voltage of the filter capacitor 1104 that is connected to the input terminal IN1. In other words, the voltage value of the filter capacitor 1104 comes to be measured. In the example shown in FIG. 9, about 10 seconds after the filter resistor 1103 has gone open circuit, the measured voltage value reaches almost 4.8V, so that it is possible to detect the occurrence of an abnormality.

If the filter resistor 1103 of the RC filter that is connected to one of the input terminals is open circuited in this manner, then, by employing the stray capacitance Cs of the multiplexer 1200 and the input terminal IN7 that is connected to the operating power supply Vcc, it is possible to charge up the filter capacitor 1104 so that its voltage becomes outside the normal voltage range (i.e. 4.8V that is on the level of Vcc). Since, if the filter resistor 1103 is not open circuited, the measured voltage value at the input terminal IN1 is 1V even though a changeover operation like the one above is performed, accordingly it is possible to detect that the filter resistor 1103 has gone open circuit by the measured voltage value becoming outside the normal voltage range.

It should be understood that the fact that, after connection to ground, the connection time period to the input terminal is set to 20 msec, this being rather long as compared to the connection time period to the input terminal of 5 μsec after connecting to Vcc, is because in the normal state the filter capacitor 1104 is charged up via the stray capacitance Cs of the multiplexer 1200, this being undesirable, and error occurs in the measured value during normal connection. If, as a countermeasure to this, measurement is performed while lengthening the time of connection to the subject of measurement, then the charge in the filter capacitor 1104 is discharged and the error in the measured voltage becomes less. If no consideration needs to be accorded to this source of error, then the operation of changing over from the input terminal IN8 to the input terminal IN1 may be omitted.

While, in the example shown in FIG. 9, control is performed so that the filter capacitor 1104 is charged up if the filter resistor 1103 is open circuited, it would also be acceptable to perform control so that the filter capacitor 1104 is discharged by repeated connection to the input terminal IN8 (GND), instead of to the input terminal IN7. Since, in this case, the measured voltage becomes ground level when the filter resistor 1103 is open circuited, accordingly it is possible to detect the occurrence of an abnormality by detecting that the measured voltage has reached ground level.

With the method described above, when connection to the subject of measurement is performed after having connected to ground (i.e. to the input terminal IN8), then the filter capacitor 1104 of the RC filter is discharged via the stray capacitance Cs of the multiplexer 1200, or, conversely, when connection to the subject of measurement is performed after having connected to Vcc (i.e. to the input terminal IN7), then the filter capacitor 1104 of the RC filter is charged up via the stray capacitance Cs of the multiplexer 1200. Accordingly, by setting the time period for connection to Vcc or ground and setting the number of time of connection to different values, it is possible to determine whether the filter capacitor 1104 becomes charged or becomes discharged. As a result, if open circuiting of the filter resistor 1103 has occurred, the measured value will go outside the range between the upper limit value and the lower limit value, so that it is possible to detect the presence of an abnormality.

Thus it will be understood that, since it is possible to determine the occurrence of an abnormality from the measured voltage values in any of the cases described above, i.e. (1) open circuiting or short circuiting of one of the thermistors 1101, (2) open circuiting or short circuiting of one of the pull-up resistors 1102, (3) short circuiting of one of the filter capacitors 1104, (4) open circuiting of the output terminal of the multiplexer 1200, (5) open circuiting or short circuiting of one of the input changeover terminals of the multiplexer 1200, accordingly, with the measurement method shown in FIG. 9 as well, it is possible to detect in a simple and easy manner the occurrence of an abnormality according to whether or not the measured voltage values are within their normal ranges. Moreover, it is also possible to detect an abnormality due to cause (6), i.e. due to one of the input terminals of the multiplexer 1200 going open circuit.

It is possible to use the voltage measurement device described above according to this embodiment of the present invention for voltage measurement for various types of equipment. For example, in relation to a battery for propulsion that is mounted to an electrically operated vehicle such as a hybrid automobile or the like as will be explained below, this voltage measurement device may be applied to measurement of the voltages of a plurality of cells included in the battery, or to measurement of the temperature of the battery or the like.

Figure 10:
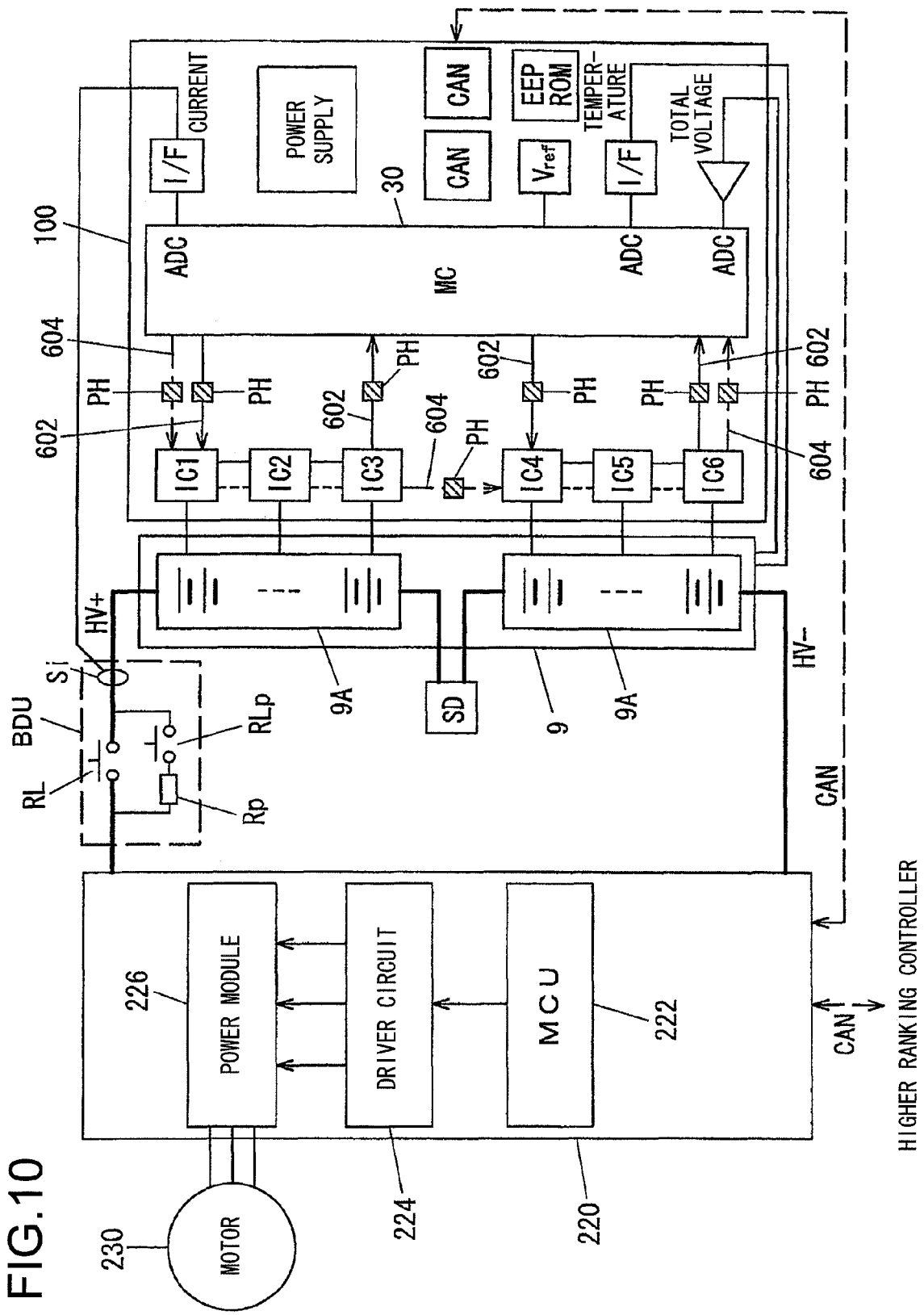
FIG. 10 is a block diagram showing a drive system for a rotating electrical machine for propulsion that is mounted to an electrically propelled vehicle.

FIG. 10 is a block diagram showing a drive system for a rotating electrical machine for propulsion that is mounted to an electrically propelled vehicle. The drive system shown in FIG. 10 includes a battery module 9, a battery monitoring device 100 that monitors the battery module 9, an inverter device 220 that converts DC electrical power from the battery module 9 into three phase AC electrical power, and a motor 230 for propelling the vehicle. The motor 230 is driven by the three phase AC electrical power from the inverter device 220. The inverter device 220 and the battery monitoring device 100 are connected together by CAN communication, and the inverter device functions as a higher ranking controller for the battery monitoring device 100. Moreover, the inverter device 220 operates on the basis of command information from a yet higher ranking controller, not shown in the figures.

The inverter device 220 includes a power module 226, an MCU 222, and a driver circuit 224 for driving the power module 226. The power module 226 converts DC electrical power supplied from the battery module 9 into three phase AC electrical power for driving the motor 230. It should be understood that a high capacity smoothing capacitor of capacitance around 700 μF to around 2000 μF is provided between high power lines HV+ and HV− that are connected to the power module 226, although this smoothing capacitor is not shown in the figure. This smoothing capacitor operates to reduce the voltage noise to which the integrated circuits provided in the battery monitoring device 100 are subjected.

In the state in which the operation of the inverter device 220 starts, the charge in the smoothing capacitor is approximately zero, and if a relay RL were simply to be closed, then a large initial current would flow into the smoothing capacitor. And, since this current would be large, there would be a fear that the relay RL might be damaged or might fail due to fusion. In order to solve this problem, according to a command from a yet higher ranking controller, when starting the driving of the motor 230, the MCU 222 changes over a pre-charge relay RLp from the opened state to the closed state and thus charges up the smoothing capacitor gradually, and only thereafter is the relay RL changed over from the opened state to the closed state, so as to start the supply of electrical power from the battery module 9 to the inverter device 220. While charging up the smoothing capacitor, this charging is performed via a resistor Rp so as to limit the maximum current. By performing this type of operation, along with protecting the relay circuitry, it is possible to reduce the maximum current flowing in the battery cells and in the inverter device 220 to no more than some predetermined value, so that it is possible to maintain high security.

It should be understood that the inverter device 220 controls the phase of the electrical power generated by the power module 226 for the rotor of the motor 230, so that the motor 230 is operated as a generator during vehicle braking. In other words, regenerative braking control can be performed by operating the motor as a generator, and at this time the electrical power that is generated is regenerated to the battery module 9, and the battery module 9 is charged up. If the state of charge of the battery module 9 has decreased below some reference state, then the inverter device 220 operates the motor 230 as a generator. And the three phase AC electrical power generated by the motor 230 is converted by the power module 226 into DC electrical power and is supplied to the battery module 9. As a result, the battery module 9 is charged up.

On the other hand, when the motor is operating for propelling the vehicle, according to a command from the higher ranking controller, the MCU 222 controls the driver circuit 224 and thereby controls the switching operation of the power module 226, so as to generate a rotating magnetic field in the direction to lead the rotation of the rotor of the motor 230. In this case, the DC electrical power from the battery module 9 is supplied to the power module 226. Moreover, when the battery module 9 is being charged up due to regenerative braking control as described above, the MCU 222 controls the driver circuit 224 and thereby controls the switching operation of the power module 226, so as to generate a rotating magnetic field in the direction to trail the rotation of the rotor of the motor 230. In this case, electrical power is supplied to the power module 226 from the motor 230, and electrical power is supplied from the power module 226 to the battery module 9. As a result, the motor 230 is caused to operate as a generator.

The power module 226 of the inverter device 220 converts electrical power between DC and AC by performing at high speed operations of turning-on and turning-off. Since high currents are intercepted at high speed at this time, accordingly large voltage fluctuations are generated due to the inductance inherent in the DC circuitry. The high capacity smoothing capacitor described above is provided in order to suppress these voltage fluctuations.

The battery module 9 includes two cell blocks 9A and 9B that are connected in series. And each of these cell blocks 9A and 9B includes sixteen battery cells that are connected in series. The cell block 9A and the cell block 9B are connected in series via a service disconnector SD for maintenance and inspection, in which a switch and a fuse are connected in series. The direct electrical circuit connection is intercepted by this service disconnector SD being opened, and in this case no current flows, even if it is supposed that a circuit connection to the vehicle has become established at some spot somewhere on the cell blocks 9A and 9B. With this type of structure, it is possible to maintain high security. Moreover, even if a person who is performing an inspection should touch between HV+ and HV−, still security is maintained, since no high voltage can come to be applied to his body.

The battery disconnector unit BDU that incorporates the relay RL, the resistor Rp, and the pre-charge relay RLp is provided in the high power line HV+ between the battery module 9 and the inverter device 220. The series circuit of the resistor Rp and the pre-charge relay RLp is connected in parallel with the relay RL.

The battery monitoring device 100 principally performs measurement of the voltages of the cells, measurement of the total voltage, measurement of the current, measurement of the cell temperatures, adjustment of the cell capacities, and so on. For doing this, six ICs (integrated circuits) are provided as cell controllers: IC1 through IC6. The sixteen battery cells provided within each of the cell blocks 9A and 9B are divided into three cell groups, and one integrated circuit is provided for each of three cell groups.

IC1 through IC6 are provided with a communication system 602 and a one-bit communication system 604. In the communication system 602 for reading the cell voltage values and transmitting various types of command, serial communication with a microcomputer 30 is performed according to the daisy chain method via insulating elements (for example, photocouplers) PH. And the one-bit communication system 604 is for transmitting an abnormality signal, for example when cell overcharging has been detected. In the example shown in the FIG. 10, the communication system 602 is divided into a higher ranking communication path to the integrated circuits IC1 through IC3 for the cell block 9A, and a lower ranking communication path to the integrated circuits IC4 through IC6 for the cell block 9B.

Each of the ICs performs abnormality diagnosis, and if it decides on its own account that an abnormality is present, or if it has received an abnormality signal at its receive terminal FFI from an IC earlier in the daisy chain, then it transmits an abnormality signal from its transmit terminal FFO. On the other hand, if an abnormality signal that it has been receiving at its receive terminal FFI ceases, or if on its own account it decides that the abnormality has disappeared, then it ceases transmitting the abnormality signal from its transmit terminal FFO. In this embodiment, this abnormality signal is a one-bit signal.

Although the microcomputer 30 itself never transmits any genuine abnormality signal to the ICs, sometimes it sends a test signal, i.e. a pseudo-abnormality signal, to the one-bit communication system 604, in order to diagnose whether the one-bit communication system 604, i.e. the transmission path for abnormality signals, is operating correctly or not. Upon receipt of this test signal, IC1 sends an abnormality signal to the communication system 604, and this abnormality signal is received by IC2. This abnormality signal is transmitted from IC2 to IC3, IC4, IC5, and IC6 in order, and finally is returned from IC6 back to the microcomputer 30. Thus, if the communication system 604 is operating normally, then the pseudo-abnormality signal transmitted from the microcomputer 30 will be returned back to the microcomputer 30 via the communication system 604. It is possible to diagnose the communication system 604 by sending a pseudo-abnormality signal and receiving it back in this manner, and accordingly the reliability of the system is enhanced.

A current sensor Si such as a Hall element or the like is installed in the battery disconnector unit BDU, and the output of this current sensor Si is inputted to the microcomputer 30. Signals related to the total voltage of the battery module 9 and to its temperature are also inputted to the microcomputer 30, and each of them is measured by an A/D converter (i.e. an ADC) within the microcomputer 30. Temperature sensors are provided at a plurality of spots within the cell blocks 9A and 9B. The voltage measurement device and the abnormality decision method of this embodiment of the present invention may be applied to this temperature measurement. In other words, the voltage signals from the temperature sensors that are provided to the cell blocks 9A and 9B may be read into a multiplexer, and the output of this multiplexer may be inputted to the microcomputer 30 of FIG. 10.

Figure 11:
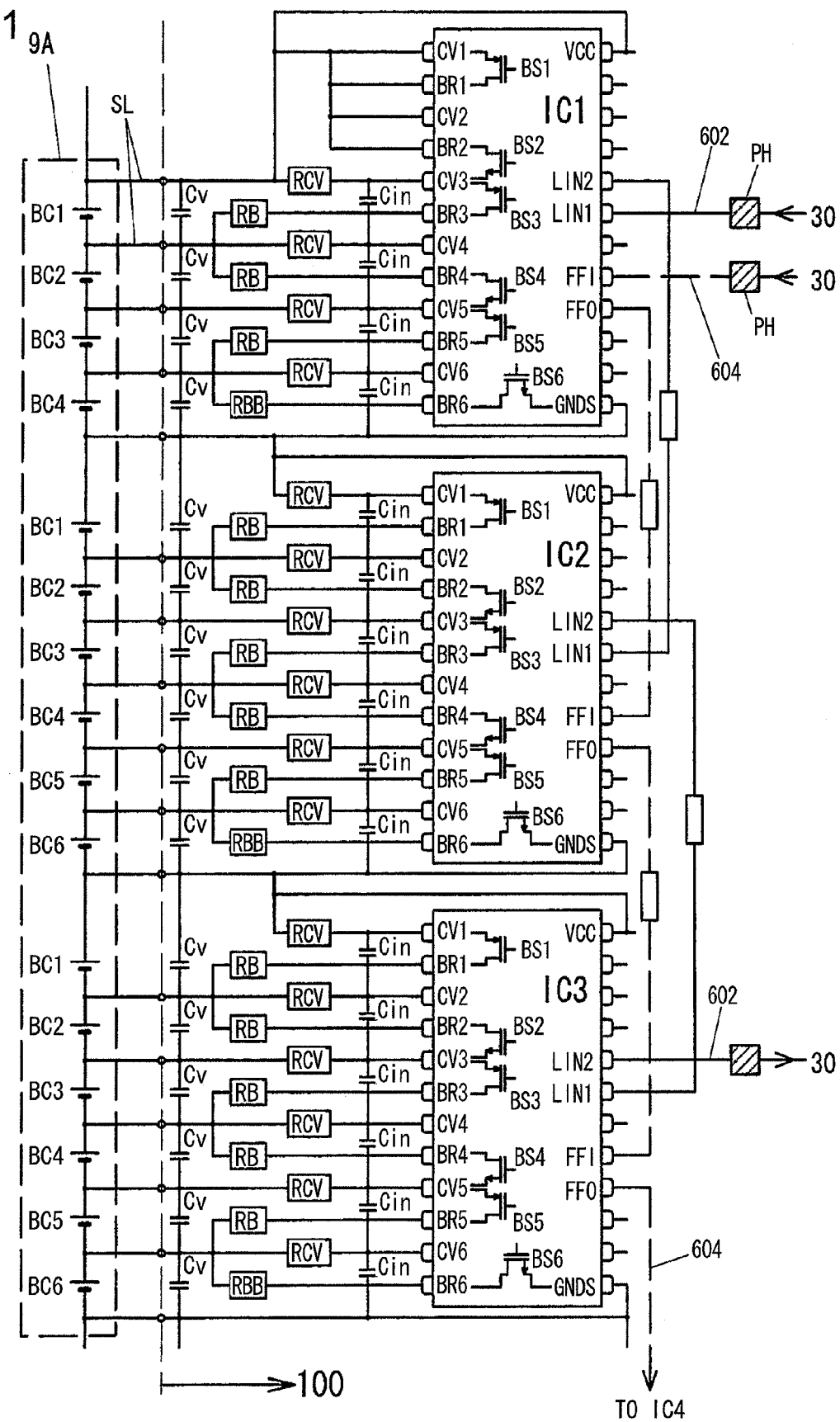
FIG. 11 is a figure showing in detail a portion of this drive system related to a cell block 9A, including integrated circuits IC1 through IC3.

FIG. 11 is a figure showing the portion related to the cell block 9A of FIG. 10, and including IC1 through IC3. It should be understood that a similar structure is provided in relation to the other cell block 9B, although this is not shown and will not be further explained. The sixteen cells provided to the cell block 9A are divided into three cell groups containing four, six, and six cells, and the integrated circuits IC1, IC2, and IC3 correspond to these three cell groups respectively. As described above, each of IC1 through IC3 monitors its corresponding cell group and detects the voltages of the plurality of cells therein. The voltage measurement device and the abnormality decision method of this embodiment of the present invention may also be applied to these integrated circuits IC1 through IC3 as well.

The terminals CV1 through CV6 of IC1 are terminals for measuring the cell voltages of the corresponding battery cells, and each of the ICs can measure the voltage of up to six cells. In the case of IC2 and IC3 each of which monitors six cells, a resistor RCV for terminal protection and for limiting the discharge current for capacity adjustment is provided in each of the voltage measurement lines to the six terminals CV1 through CV6. On the other hand, in the case of IC1 that monitors only four cells, a resistor RCV for terminal protection and for limiting the discharge current for capacity adjustment is provided in each of the voltage measurement lines to the four terminals CV3 through CV6. Each of these measurement lines is connected to the positive electrode or to the negative electrode of one of the battery cells BC via a sensing line SL. It should be understood that the GNDS terminals of IC2 and IC3 are connected to the negative electrode of the battery cell BC6. For example, when the cell voltage of the battery cell BC1 is to be measured, then the voltage between the terminals CV1 and CV2 is measured. Moreover, when the cell voltage of the battery cell BC6 is to be measured, then the voltage between the terminals CV6 and GNDS is measured. And in the case of IC1, the cell voltages of the battery cells BC1 through BC4 are measured using the terminals CV3 through CV6 and the GNDS terminal. Capacitors Cv and Cin are provided between the voltage measurement lines as noise countermeasures.

In order to realize the performance of the battery module 9 to its maximum extent, it is necessary to equalize the cell voltages of the 32 cells. For example, if the variation in the cell voltages is great, then during regenerative charging it is necessary to stop the regeneration operation at the time point that the voltage of the battery cell whose voltage is the highest reaches the upper limit voltage. In this case, the operation of regeneration is stopped even though the other cell voltages of the other battery cells have not yet reached the upper limit voltage, and accordingly subsequently energy comes to be wasted by conventional braking. In order to prevent this type of occurrence, according to a command from the microcomputer 30, each of the ICs performs discharge in order to adjust the capacity of the battery cells that it manages.

As shown in FIG. 11, each of the integrated circuits IC1 through IC3 is provided with balancing switches BS1 through BS6 for adjusting the capacities of the battery cells between its terminal pairs CV1-BR1, BR2-CV3, CV3-BR3, BR4-CV5, CV5-BR5, and BR6-GNDS. For example, when discharge of the battery cell BC1 of IC1 is to be performed, then the balancing switch BS3 is turned ON. When this is done, a balancing current flows along the path: from positive electrode of battery cell CV1 to resistor RCV to terminal CV1 to balancing switch BS3 to terminal BR3 to resistor RB to negative electrode of battery cell CV1. RB or RBB is a resistor for balancing.

The communication systems 602 and 604 described above are provided between IC1, IC2, and IC3. Communication command froms the microcomputer 30 are inputted to the communication system 602 via a photocoupler PH, and are received at the receive terminal LIN1 of IC1 via the communication system 602. And data and/or commands corresponding to these communication commands are transmitted from the transmit terminal LIN2 of IC1. These communication commands are received by the receive terminal LIN1 of IC2, and are transmitted from its transmit terminal LIN2. Reception and transmission are performed in this manner in order, and the transmitted signal is transmitted from the transmit terminal LIN2 of IC3, and is finally received at the receive terminal of the microcomputer 30 via a photocoupler PH. According to the details of the communication command that they have received, IC1 through IC3 perform transmission of measured data for the cell voltages and so on, or perform balancing operation. Moreover, IC1 through IC3 also detect cell overcharging on the basis of the cell voltages that have been measured. The results of this detection (i.e. abnormality signals) are transmitted to the microcomputer 30 via the signal system 604.

Figure 12:
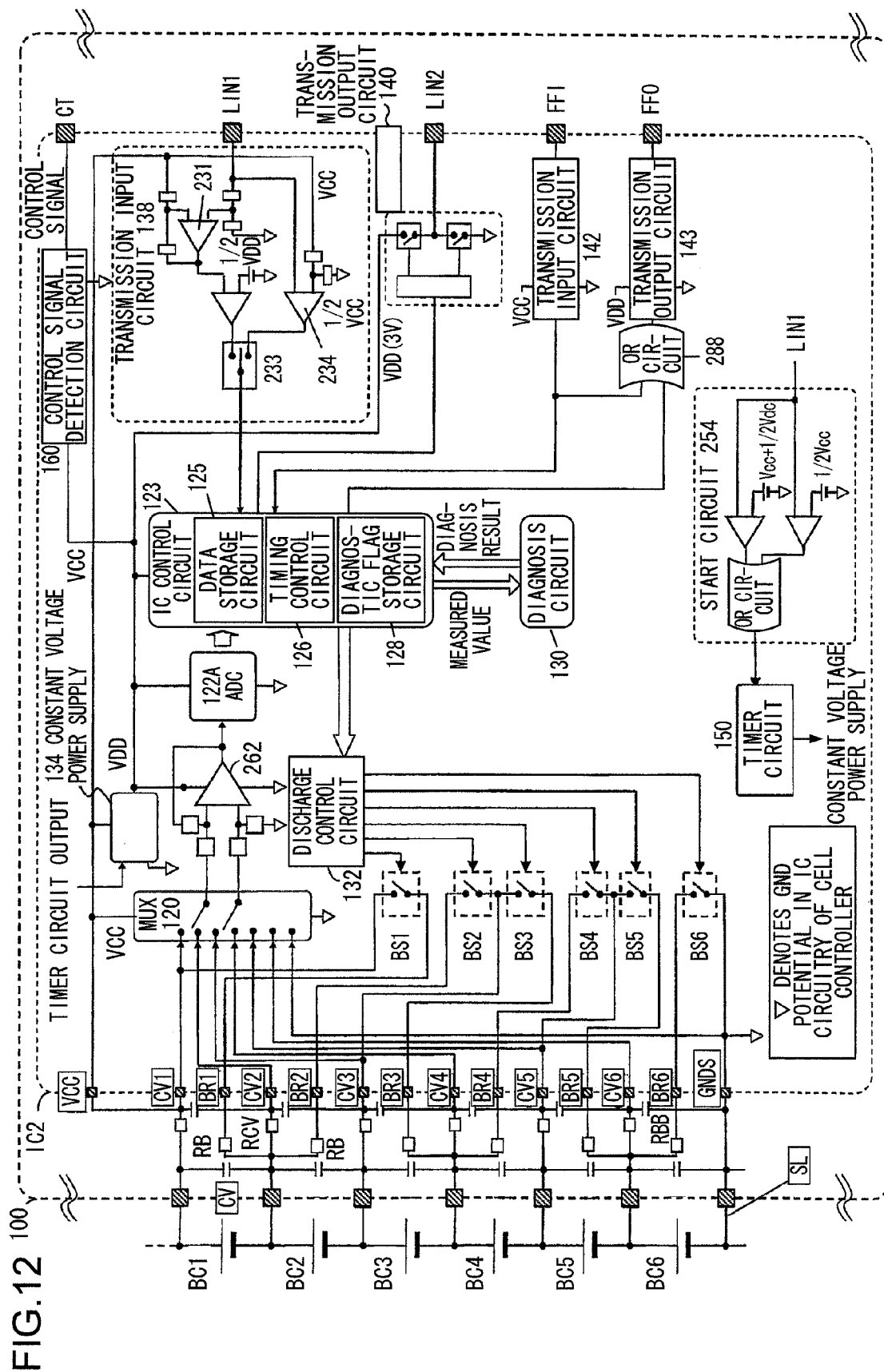
FIG. 12 is a schematic figure showing blocks internal to one of these ICs.

FIG. 12 is a figure schematically showing the interior of one of the integrated circuits, and shows, as an example, the integrated circuit IC2 to which six battery cells BC1 through BC6 are connected. Although explanation thereof is omitted, it should be understood that the other ICs have similar structures. A multiplexer 120 and an analog to digital converter 122A that serve as a cell state detection circuit, an IC control circuit 123, a diagnosis circuit 130, transmission input circuits 138 and 142, transmission output circuits 140 and 143, a start circuit 254, a timer circuit 150, a control signal detection circuit 160, a differential amplifier 262, and an OR circuit 288 are provided to this integrated circuit IC2.

The potentials at the terminals of the battery cells BC1 through BC6 are inputted to the terminals CV1 through CV6 and to the terminal GNDS. When voltage measurement is to be performed, the multiplexer 120 selects an appropriate pair of the terminals CV1 through CV6 and the terminal GNDS, and inputs the voltage between these two terminals to the differential amplifier 262. The output of the differential amplifier 262 is converted into a digital value by the analog to digital converter 122A. The voltage between the pair of terminals that has thus been converted into a digital value is sent to the IC control circuit 123, and is stored internally to a data storage circuit 125. The potentials at the terminals of the battery cells BC1 through BC6 that are inputted to the terminals CV1 through CV6 and GNDS are biased with respect to the ground potential of IC2 by potentials based upon the voltages of the battery cells that are connected in series. The influence of the bias potentials described above is eliminated by the differential amplifier 262 mentioned above, and thus analog values based upon the potentials of each of the battery cells BC1 through BC6 are inputted to the analog to digital converter 122A.

Along with being endowed with a calculation function, the IC control circuit 123 also includes the data storage circuit 125, a timing control circuit 126 that performs voltage measurement and state diagnosis on a periodic cycle, and a diagnostic flag storage circuit 128 in which diagnosis flags are set from the diagnosis circuit 130. The IC control circuit 123 decrypts the contents of communication commands that are inputted from the transmission input circuit 138, and performs processing according to these contents. As commands, for example, there are included commands that request values of voltages measured between the terminals of the battery cells, commands that request electrical operation for adjusting the states of charge of the battery cells, commands that request starting of the operation of this IC (wake-up commands), commands that request stopping of its operation (sleep commands), commands that request address setting, and so on.

On the basis of the measured values from the IC control circuit 123, the diagnosis circuit 130 performs diagnosis of various types, for example overcharge diagnosis and overdischarge diagnosis and so on. The data storage circuit 125 (that may for example consist of a register circuit) stores the voltages between the various terminals of the battery cells BC1 through BC6 that have been detected in correspondence with these battery cells BC1 through BC6, and also other values that have been detected, in addresses that have been determined in advance, so that they can be read out.

At least two power supply voltages VCC and VDD of different types are used in the internal circuitry of the integrated circuit IC2. In the example shown in FIG. 12, the voltage VCC is the total voltage of the battery cell group made up of the battery cells BC1 through BC6 that are connected in series, while the voltage VDD is a voltage that is generated by the constant voltage power supply 134. The multiplexer 120 and the transmission input circuits 138 and 142 for signal reception operate upon the high voltage VCC. On the other hand, the analog digital converter 122A, the IC control circuit 123, the diagnosis circuit 130, and the transmission output circuits 140 and 143 for signal transmission operate upon the low voltage VDD.

The signal received at the receive terminal LIN1 of IC2 is inputted to the transmission input circuit 138, while the signal that is received at the receive terminal FFI is inputted to the transmission input circuit 142. The transmission input circuit 142 is built with a similar circuit structure to that of the transmission input circuit 138. The transmission input circuit 138 includes a circuit 231 that receives signals from another adjacent IC, and a circuit 234 that receives a signal from a photocoupler PH.

As shown in FIG. 11, in the case of the integrated circuit IC1 that is the one having the highest precedence, the signal from a photocoupler PH is inputted at the receive terminal LIN1, while, in the case of the other integrated circuits IC2 and IC3, the signal from the adjacent IC is inputted at the receive terminal LIN1. Due to this, the one of the circuits 231 and 234 that is to be used is selected by the changeover device 233 on the basis of a control signal supplied to the control terminal CT shown in FIG. 12. The control signal supplied at the control terminal CT is inputted to a control signal detection circuit 160, and the changeover device 233 performs changeover operation according to a command from this control signal detection circuit 160.

In other words, in the case of the IC that is the first one in the direction of transmission (i.e. in the case of the integrated circuit IC1 that has the highest precedence), if a signal is inputted from the higher ranking controller (the microcomputer 30) to the receive terminal LIN1, then the changeover device 233 closes the changeover device 233 to its lower contact point in FIG. 12, so that the output signal from the circuit 234 is outputted from the transmission input circuit 138. On the other hand, if a signal is inputted from the adjacent IC to the receive terminal LIN1, then the changeover device 233 closes the changeover device 233 to its upper contact point in FIG. 12, so that the output signal from the circuit 231 is outputted from the transmission input circuit 138. Since, in the case of the integrated circuit IC2 shown in FIG. 12, it is a signal from the adjacent integrated circuit IC1 that is inputted, accordingly the changeover device 233 closes the changeover device 233 to its upper contact point in FIG. 12. Since the peak values of the output waveforms of the output from the higher ranking controller (i.e. from the microcomputer 30) and of the output from the transmit terminal LIN2 of the adjacent IC are different, accordingly their threshold values for decision must be different. This is the reason why it is arranged to change over the changeover device 233 of the circuit 138 on the basis of the control signal at the control terminal TC. It should be understood that a similar structure is also provided for the communication system 604.

A communication command that has been received at the receive terminal LIN1 is inputted to the IC control circuit 123 via the transmission input circuit 142. And the IC control circuit 123 outputs data and/or a command corresponding to the communication command that has been received to the transmission output circuit 140. This data and/or command is transmitted to the transmit terminal LIN2 via the transmission output circuit 140. It should be understood that the transmission output circuit 143 also has a structure similar to that of the transmission output circuit 140.

The signal that is received at the terminal FFI is used for transmitting the abnormality state (such as an overcharge signal). When a signal indicating an abnormality is received from the terminal FFI, this signal is inputted to the transmission output circuit 143 via the transmission input circuit 142 and the OR circuit 288, and is outputted from the transmission output circuit 143 via the terminal FFO. Furthermore, when an abnormality is detected by the diagnosis circuit 130, irrespective of the contents received at the terminal FFI, a signal specifying the abnormality is inputted from the diagnostic flag storage circuit 128 to the transmission output circuit 143 via the OR circuit 288, and is outputted from the transmission output circuit 143 via the terminal FFO.

When a signal transmitted from the adjacent IC or from the photocoupler PH is received by the start circuit 254, the timer circuit 150 operates, and the voltage VCC is supplied to the constant voltage power supply 134. Due to this operation, the constant voltage power supply 134 goes into the operational state, and outputs the constant voltage VDD. And, when the constant voltage VDD is thus outputted from the constant voltage power supply 134, the IC2 awakes from its sleep state and goes into its operational state.

As previously described, the balancing switches SB1 through SB6 are provided within the IC for adjusting the amount of charge of the battery cells BC1 through BC6. In this embodiment, PMOS switches are used for the balancing switches BS1, BS3, and BS5, while NMOS switches are used for the balancing switches BS2, BS4, and BS6.

The opening and closing of these balancing switches BS1 through BS6 is controlled by a discharge control circuit 132.

On the basis of a command from the microcomputer 30, command signals for making the balancing switches that correspond to the cells that ought to be discharged go to continuous are sent from the IC control circuit 123 to the discharge control circuit 132. And, by communication from the microcomputer 30, the IC control circuit 123 receives commands for discharge time periods corresponding to each of the battery cells BC1 through BC6, and executes the discharge operation described above.

Figure 13:
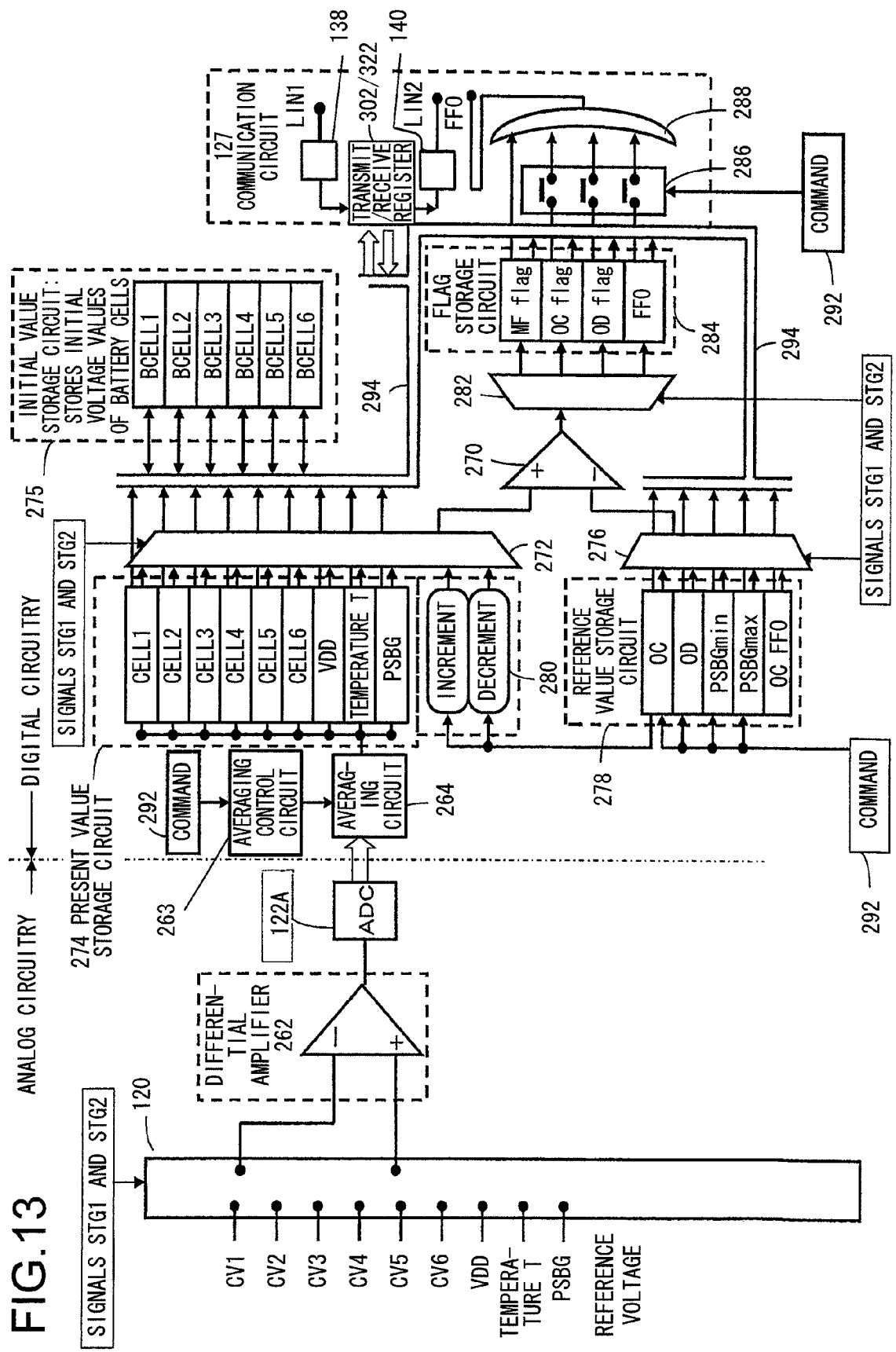
FIG. 13 is a block diagram showing the details of a portion of the digital circuitry internal to the IC shown in FIG. 12.

The block diagram given in FIG. 13 is a figure showing in detail in block form a portion of the digital circuitry internal to the IC shown in FIG. 12. The multiplexer 120 inputs signals STG1 and STG2 from a decoder not shown in the figures, and performs the operation of selection by the multiplexer 120 on the basis of these signals. If the voltage of the battery cell BC1 is to be measured, for example, then, when the terminal CV1 and the terminal CV2 are selected, the voltage of the battery cell BC1 is outputted from the multiplexer 120 to the differential amplifier 262. Now, this measurement of the voltages between the terminals of the battery cells will be explained.

It should be understood that, since the battery cells BC1 through BC4 (or BC1 through BC6) are connected in series, accordingly the negative electrode potentials of the voltages between their terminals are different. Due to this, the differential amplifier 262 is used in order to standardize these reference potentials (the GND potentials in IC1 through IC3). The output of the differential amplifier 262 is converted to a digital value by the analog to digital converter 122A, and is outputted to an averaging circuit 264. The averaging circuit 264 obtains the average value of measurement a predetermined number of times. In the case of the battery cell BC1, this average value is stored in a register CELL1 of a present value storage circuit 274. It should be understood that the present value storage circuit 274, the initial value storage circuit 275, and the reference value storage circuit 278 of FIG. 13 correspond to the data storage circuit 125 of FIG. 12.

The averaging circuit 264 calculates the average value of the number of times of measurement stored in the averaging control circuit 263, and stores its output in the present value storage circuit 274 described above. If the averaging control circuit 263 commands "1" time, then the output of the analog to digital converter 122A is stored in the register CELL1 of the present value storage circuit 274 just as it is without being averaged. However, if the averaging control circuit 263 commands "4" times, then the results of measuring the voltage between the terminals of the battery cell BC1 four times are averaged together, and this average value is stored in the register CELL1 of the present value storage circuit 274 described above. DC electrical power from the battery module 9 shown in FIG. 10 is supplied to the inverter device, and is converted into AC electrical power. While, during the conversion of DC electrical power into AC electrical power by the inverter device, currents are switched on and switched off at high speeds, and a large amount of noise is generated at this time, there is the beneficial effect that it is possible to reduce the negative influence exerted by this type of noise, due to the provision of the averaging circuit 264.

The digital value of the voltage between the terminals of the battery cell BC1 that has thus been digitally converted is stored in the register CELL1 of the present value storage circuit 274. And the voltages between the terminals of the battery cell BC2, between the terminals of the battery cell BC3, and between the terminals of the battery cell BC4 are measured in a similar manner.

As has been explained above, with this embodiment, in the voltage measurement device 1000 that includes: the multiplexer 1200 that has the plurality of input terminals IN1 through IN8 at which voltage signals are inputted from a plurality of subjects for measurement (the thermistors 1101) and the input changeover terminals A through C at which changeover signals for changing over the input terminals IN1 through IN8 are inputted; and the microcomputer 1300 that inputs changeover signals to the input changeover terminals A through C and thus selects one of the plurality of input terminals IN1 through IN8, and performs voltage measurement by acquiring the voltage signal at the selected input terminal from the multiplexer 1200, and makes a decision as to whether or not an abnormality has occurred on the basis of the voltage values that have been measured, wherein: the plurality of input terminals IN1 through IN8 include input terminals IN1 through IN6 at which voltage signals from the plurality of subjects of measurement are inputted and the input terminals IN7 and IN8 at which potentials for diagnosis are inputted; and the microcomputer 1300, when performing voltage measurement for the plurality of thermistors 1101, measures the voltages at the input terminals IN1 through IN8 at which the voltage signals from the plurality of subjects of measurement are inputted, and the voltages at the input terminals IN7 and IN8 at which the potentials for diagnosis are inputted, and makes a decision as to an abnormality on the basis of the voltage values that have been measured.

With the above structure it becomes possible to determine upon the presence or absence of an abnormality in the voltage measurement device 100 from the results of voltage measurement, without specially providing any circuit for diagnosis as in the prior art. It should be understood that it would be acceptable to arrange for this decision relating to abnormality to be performed by the microcomputer 1300, or to be performed by a control device that is provided at a higher level.

For example a voltage source that generates a voltage higher than the normal voltage range for the subject of measurement is connected to the input terminal IN7 at which one of the potentials for diagnosis is inputted. Moreover, the ground of the multiplexer 1200 is connected to the input terminal IN8 at which the other potential for diagnosis is inputted. While, in the embodiment described above, the operating power supply (Vcc) of the multiplexer 1200 is used as the voltage source that generates a voltage higher than the normal voltage range for the subject of measurement, this voltage source need not necessarily be the operating power supply (Vcc); it would also be acceptable to connect some other voltage source, provided that it is a voltage source that generates a voltage larger than the voltage for the subject of measurement during normal conditions, such as for example a reference voltage for an A/D converter or a power supply voltage for a sensor or the like, with which the multiplexer 1200 and the A/D converter operates normally.

For example, if the measured voltage values at the input terminals IN1 through IN6 and the input terminal IN7 and/or the input terminal IN8 are all the same value, then it is possible to determine that there is an open circuiting abnormality at the output terminal OUT for outputting the selected voltage signal from the multiplexer to the microcomputer 1300.

Moreover, it is possible to decide that there is open circuiting or short circuiting of one of the input changeover terminals A through C, when the measured voltage values at the input terminals IN7 and IN8 at which the potentials for diagnosis are inputted are different from the voltage values corresponding to the potentials for diagnosis.

Furthermore, when measuring the voltages at the input terminals IN1 through IN6, for example when measuring the voltage at the input terminal IN1, it may be practiced to select the input terminal IN1 and to perform voltage measurement thereof, after having temporarily selected the input terminal IN7. And it is decided that an open circuiting abnormality has occurred at the input terminal IN1, when this measured voltage value is higher than a threshold value that has been set on the basis of the voltage value Vcc of the operating power supply (i.e. a threshold value for deciding that the measured voltage value is at the level of Vcc). It should be understood that, instead of the input terminal IN7 being temporarily selected, it would also be acceptable to arrange for the input terminal IN8 to be temporarily selected. In which case, it is decided that an open circuiting abnormality has occurred at the input terminal IN1, when the measured voltage value is lower than a threshold value that has been set on the basis of ground potential (i.e. a threshold value for deciding that the measured voltage value is at the level of ground potential). It should also be understood that these threshold values are set on the basis of values that are actually measured by experiment or the like.

Moreover, when measuring the voltages at the input terminals IN1 through IN6, for example when measuring the voltage at the input terminal IN1, it may be practiced to perform a first measurement in which the input terminal IN8 is temporarily selected and then the input terminal IN1 is selected and voltage measurement thereof is performed, and then to perform a second measurement in which the input terminal IN7 is temporarily selected and then the input terminal IN1 is selected and voltage measurement thereof is performed. And it is decided that an open circuiting abnormality has occurred at the input terminal IN1, when the difference between the value of the voltage detected by the second voltage measurement and the value of the voltage detected by the first voltage measurement is greater than a threshold value that is set on the basis of the voltage value Vcc of the operating power supply (i.e. a threshold value for deciding that the measured voltage value is at the level of Vcc). It should be understood that this threshold value is set on the basis of a value that is actually measured by experiment or the like.

Moreover, when measuring the voltages at the input terminals IN1 through IN6, in the case of measurement of one of the voltage values for which an RC filter that consists of a filter resistor 1103 and a filter capacitor 1104 is provided between the corresponding one of the input terminals IN1 through IN6 and the corresponding subject of measurement (i.e. the corresponding one of the thermistors 1101), for example when measuring the voltage at the input terminal IN1, the operation of temporarily selecting the input terminal IN7 and subsequently temporarily selecting the input terminal IN1 may be performed one time or more, with the input terminal IN1 subsequently being selected and voltage measurement being performed. Since the filter capacitor 1104 is charged up by performing this type of measurement operation, accordingly it is possible to determine if an open circuiting abnormality of the filter resistor 1103 has occurred when the voltage value that is measured is higher than a predetermined threshold value that is set on the basis of the voltage value of the operating power supply Vcc (i.e. a threshold value for deciding that the measured voltage value is at the level of Vcc).

Conversely it would also be acceptable to arrange, when measuring the voltages at the input terminals IN1 through IN6, for example when measuring the voltage at the input terminal IN1, to perform the operation of temporarily selecting the input terminal IN8 and subsequently temporarily selecting the input terminal IN1 one time or more, with the input terminal IN1 subsequently being selected and voltage measurement being performed. Since the filter capacitor 1104 is discharged in this case, accordingly it is possible to determine if an open circuiting abnormality of the filter resistor 1103 has occurred when the voltage value that is measured is lower than a predetermined threshold value that is set on the basis of the ground potential (i.e. a threshold value for deciding that the measured voltage value is at ground level). It should be understood that this threshold value is set on the basis of a value that is actually measured by experiment or the like.

The multiplexer 1200 has the operation control terminal INH at which are inputted an inactivating signal (an H level signal) that cuts off and puts into the inactivated state all of the plurality of input terminals IN1 through IN8 and also the output terminal OUT, irrespective of the changeover signals that are inputted to the input changeover terminals A through C, and an activating signal (an L level signal) that puts into the activated state that one of the input terminals IN1 through IN8 that is selected on the basis of the changeover signals that are inputted to the input changeover terminals A through C.

Thus, as shown in FIG. 4, when changing over the state of selection of the input terminals IN1 through IN8, it is possible to prevent momentary connection to some input terminal other than the desired one thereof taking place during changeover of the inputs of the multiplexer 1200 by, after having first inputted an inactivating signal from the microcomputer 1300 to the operation control terminal INH of the multiplexer 1200, subsequently inputting a changeover signal to the input changeover terminals A through C and then inputting an activating signal to the operation control terminal INH. As a result, it is possible to eliminate any influence due to charging or discharging the stray capacitance of the multiplexer 1200, so that it becomes possible to enhance the reliability. It should be understood that while, in the embodiment described above, the use was explained of a changeover sequence as shown in FIG. 4 in relation to the prior art measurement and control sequence shown in FIG. 5, it could also be applied, in a similar manner, in relation to a measurement and control sequence as shown in FIG. 6, FIG. 7, or FIG. 9 as well.

The various embodiments described above may be used either individually, or in any combination. This is because it is possible to obtain the beneficial effects of the various embodiments either singly or in mutual synergy. Moreover, the present invention should not be considered as being in any way limited by the embodiments described above, provided that the distinguishing features of the present invention are preserved.

What is claimed is:

1. A voltage measurement device, comprising:
a multiplexer that includes a plurality of input terminals at which voltage signals are inputted, an input changeover terminal at which a changeover signal for changing over the plurality of input terminals is inputted, and an output terminal;
a control circuit that performs voltage measurement by inputting the changeover signal to the input changeover terminal of the multiplexer and thus causing the multiplexer to select one of the plurality of input terminals, and by acquiring the voltage signal at a selected input terminal from the multiplexer; and
a decision circuit that makes a decision as to whether or not an abnormality has occurred, based upon voltage values measured by the control circuit, wherein:
the plurality of input terminals include input terminals at which voltage signals from a plurality of subjects of measurement are inputted, and an input terminal at which a potential for diagnosis is inputted;
the control circuit, when performing voltage measurement for the plurality of subjects of measurement, measures voltages at the input terminals at which the voltage signals from the plurality of subjects of measurement are inputted, and a voltage at the input terminal at which the potential for diagnosis is inputted;

the decision circuit makes a decision as to an abnormality, based upon the voltage values measured by the control circuit;

the input terminal at which the potential for diagnosis is inputted includes an input terminal at which a voltage source that generates a voltage higher than a normal voltage range for the subjects of measurement is connected, and an input terminal at which a ground of the multiplexer is connected;

the control circuit, when measuring a voltage at an input terminal at which a voltage signal from one of the subjects of measurement is inputted, performs a first voltage measurement in which, after having temporarily selected the input terminal that is connected to the ground, the input terminal at which the voltage signal from that one of the subjects of measurement is inputted is selected to be measured, and a second voltage measurement in which, after having temporarily selected the input terminal that is connected to the voltage source, the input terminal at which the voltage signal from that one of the subjects of measurement is inputted is selected to be measured; and the decision circuit determines that there is an open circuiting abnormality of the input terminal at which the voltage signal from that one of the subjects of measurement is inputted, when a difference between a voltage value measured in the second voltage measurement and a voltage value measured in the first voltage measurement is greater than a threshold value that is determined based upon a voltage value of the voltage source.

2. A voltage measurement device according to claim 1, wherein a voltage source that generates a voltage higher than a normal voltage range for the subjects of measurement is connected to the input terminal at which the potential for diagnosis is inputted.

3. A voltage measurement device according to claim 2, wherein:

the multiplexer includes an operation control input terminal at which an inactivating signal that, irrespective of the changeover signal inputted to the input changeover terminal, makes an inactivated state in which all of the plurality of input terminals and the output terminal are disconnected to each other, and an activating signal that makes the changeover signal inputted to the input changeover terminal effective, are inputted; and the control circuit, when changing over a state of selection of the input terminals, after having inputted the inactivating signal to the multiplexer, then inputs the changeover signal and the activating signal.

4. A voltage measurement device according to claim 2, wherein:

the control circuit, after having temporarily selected the input terminal that is connected to the voltage source, then selects an input terminal at which a voltage signal from one of the subjects of measurement is inputted and performs voltage measurement; and the decision circuit determines that there is an open circuiting abnormality of the input terminal at which the voltage signal from that one of the subjects of measurement is inputted, when the measured voltage value is higher than a threshold value that is determined based upon the voltage value of the voltage source.

5. A voltage measurement device according to claim 2, further comprising:

RC filters each comprising a filter resistor and a filter capacitor, provided between the input terminals and the subjects of measurement, wherein:

the control circuit performs one or more times an operation of temporarily selecting the input terminal that is connected to the voltage source, and then selecting the input terminal at which a voltage signal from one of the subjects of measurement is inputted, and thereafter performs voltage measurement at the input terminal at which the voltage signal from that one of the subjects of measurement is inputted; and the decision circuit determines that there is an open circuiting abnormality of the filter resistor corresponding to the input terminal, when the measured voltage value is higher than a threshold value that has been determined based upon the voltage value of the voltage source.

6. A voltage measurement device according to claim 2, further comprising:

RC filters each comprising a filter resistor and a filter capacitor, provided between the input terminals and the subjects of measurement, wherein:

the control circuit performs one or more times an operation of temporarily selecting the input terminal that is connected to the ground, and then selecting the input terminal at which a voltage signal from one of the subjects of measurement is inputted, and thereafter performs voltage measurement at the input terminal at which the voltage signal from that one of the subjects of measurement is inputted; and the decision circuit determines that there is an open circuiting abnormality of the filter resistor corresponding to the input terminal, when the measured voltage value is lower than a threshold value that has been determined based upon a ground potential.

7. A voltage measurement device according to claim 1, wherein a ground of the multiplexer is connected to the input terminal at which the potential for diagnosis is inputted.

8. A voltage measurement device according to claim 7, wherein:

the control circuit, after having temporarily selected the input terminal that is connected to the ground, then selects an input terminal at which a voltage signal from one of the subjects of measurement is inputted and performs voltage measurement; and the decision circuit determines that there is an open circuiting abnormality of the input terminal at which the voltage signal from that one of the subjects of measurement is inputted, when the measured voltage value is lower than a threshold value that is determined based upon ground potential.

9. A voltage measurement device according to claim 1, wherein the decision circuit determines that there is an abnormality of the multiplexer, when the measured voltage values at the plurality of input terminals are all the same value.

10. A voltage measurement device according to claim 1, wherein the decision circuit determines that there is an abnormality of the multiplexer, when a measured voltage value at the input terminal at which the potential for diagnosis is inputted is different from a voltage value corresponding to the potential for diagnosis.

11. A voltage measurement device according to claim 1, wherein:

the control circuit, after having temporarily selected the input terminal that is connected to the voltage source, then selects an input terminal at which a voltage signal from one of the subjects of measurement is inputted and performs voltage measurement; and the decision circuit determines that there is an open circuiting abnormality of the input terminal at which the voltage signal from that one of the subjects of measurement is inputted, when the measured voltage value is higher than a threshold value that is determined based upon the voltage value of the voltage source.

12. A voltage measurement device according to claim 1, wherein:

the control circuit, after having temporarily selected the input terminal that is connected to the ground, then selects an input terminal at which a voltage signal from one of the subjects of measurement is inputted and performs voltage measurement; and the decision circuit determines that there is an open circuiting abnormality of the input terminal at which the voltage signal from that one of the subjects of measurement is inputted, when the measured voltage value is lower than a threshold value that is determined based upon ground potential.

13. A voltage measurement system comprising:

a voltage measurement device that contains a multiplexer that includes a plurality of input terminals at which voltage signals are inputted, an input changeover terminal at which a changeover signal for changing over the plurality of input terminals are inputted, and an output terminal, and a control circuit that performs voltage measurement by inputting the changeover signal to the input changeover terminal of the multiplexer and thus causing the multiplexer to select one of the plurality of input terminals, and by acquiring the voltage signal at the selected input terminal from the multiplexer; and a decision device to which the measured voltage values outputted from the control circuit are inputted, and that makes a decision as to whether or not an abnormality has occurred based upon the voltage values measured by the control circuit, wherein:

the plurality of input terminals include input terminals at which voltage signals from the plurality of subjects of measurement are inputted, and an input terminal at which a potential for diagnosis is inputted;

the control circuit, when performing voltage measurement for the plurality of subjects of measurement, measures voltages at the input terminals at which the voltage signals from the plurality of subjects of measurement are inputted, and a voltage at the input terminal at which the potential for diagnosis is inputted;

the input terminal at which the potential for diagnosis is inputted includes an input terminal at which a voltage source that generates a voltage higher than a normal voltage range for the subjects of measurement is connected, and an input terminal at which a ground of the multiplexer is connected;

the control circuit, when measuring a voltage at an input terminal at which a voltage signal from one of the subjects of measurement is inputted, performs a first voltage measurement in which, after having temporarily selected the input terminal that is connected to the ground, the input terminal at which the voltage signal from that one of the subjects of measurement is inputted is selected to be measured, and a second voltage measurement in which, after having temporarily selected the input terminal that is connected to the voltage source, the input terminal at which the voltage signal from that one of the subjects of measurement is inputted is selected to be measured; and the decision circuit determines that there is an open circuiting abnormality of the input terminal at which the voltage signal from that one of the subjects of measurement is inputted, when a difference between a voltage value measured in the second voltage measurement and a voltage value measured in the first voltage measurement is greater than a threshold value that is determined based upon a voltage value of the voltage source.

* * * * *